(12) United States Patent
Okuda et al.

(10) Patent No.: US 10,638,651 B2
(45) Date of Patent: Apr. 28, 2020

(54) COMPONENT PLACING DEVICE AND COMPONENT PLACING METHOD

(71) Applicant: Panasonic Intellectual Property Management Co., Ltd., Osaka (JP)

(72) Inventors: Osamu Okuda, Fukuoka (JP); Kazunobu Sakai, Yamanashi (JP); Eyri Watari, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 301 days.

(21) Appl. No.: 15/886,883

(22) Filed: Feb. 2, 2018

(65) Prior Publication Data
US 2018/0235118 A1 Aug. 16, 2018

(30) Foreign Application Priority Data

Feb. 15, 2017 (JP) ................................ 2017-026097

(51) Int. Cl.
*H05K 13/04* (2006.01)
*H05K 13/08* (2006.01)

(52) U.S. Cl.
CPC ....... *H05K 13/0408* (2013.01); *H05K 13/041* (2018.08); *H05K 13/043* (2013.01); *H05K 13/0409* (2018.08); *H05K 13/0413* (2013.01); *H05K 13/0452* (2013.01);
(Continued)

(58) Field of Classification Search
CPC .......... H05K 13/0404; H05K 13/0408; H05K 13/0409; H05K 13/041; H05K 13/0413; H05K 13/0452; H05K 13/08; H05K 13/0813; Y10T 29/4913; Y10T 29/49131; Y10T 29/49133; Y10T 29/53174;
(Continued)

(56) References Cited

U.S. PATENT DOCUMENTS 6,276,051 B1 * 8/2001 Asai ..................... H05K 13/041
29/740
7,603,766 B2 * 10/2009 Kawada ............. H05K 13/0404
29/743
(Continued)

FOREIGN PATENT DOCUMENTS

JP 2000-294990 10/2000
JP 2013-069798 4/2013

*Primary Examiner* — Peter Dungba Vo
*Assistant Examiner* — Joshua D Anderson
(74) *Attorney, Agent, or Firm* — Pearne & Gordon LLP

(57) ABSTRACT

A component placing device has a configuration where a plurality of nozzle shafts are moved in turn to a plurality of stations including a component holding and placing station and a component detecting station by rotating a rotating object having the plurality of nozzle shafts, in which nozzles are installed, about a rotation axis. A configuration where a flow path switcher, which selectively connects a suction path of each of the nozzles to a positive pressure source and to a negative pressure source by movement of a spool, is disposed on an inside of a corresponding one of the nozzle shafts, and air for power to drive the spool is supplied to the rotating object via a manifold, in which a communication plug for power air that comes into contact with an exterior surface of the rotating object is provided, is adopted.

13 Claims, 11 Drawing Sheets

(52) U.S. Cl.
CPC ......... *H05K 13/08* (2013.01); *H05K 13/0813* (2018.08); *Y10T 29/53174* (2015.01); *Y10T 29/53191* (2015.01)

(58) Field of Classification Search
CPC ......... Y10T 29/53178; Y10T 29/53187; Y10T 29/53191
See application file for complete search history.

(56) References Cited

U.S. PATENT DOCUMENTS 10,462,947 B2 * 10/2019 Ito ..................... H05K 13/0413
2004/0037055 A1    2/2004 Kawada

* cited by examiner

COMPONENT PLACING DEVICE AND COMPONENT PLACING METHOD

BACKGROUND

1. Technical Field

The present disclosure relates to a component placing device and a component placing method for holding a component by means of a negative pressure to place the component at a predetermined placement position on a workpiece.

2. Description of the Related Art

A placing head that includes a nozzle which sucks and holds a component by means of a negative pressure is used in a component placing device that places a component onto a workpiece such as a board. As such a placing head, a rotary type placing head in which a plurality of nozzles are disposed so as to rotate freely about an axis of a head center is known (for example, refer to Japanese Patent Unexamined Publication No. 2000-294990 and Japanese Patent Unexamined Publication No. 2013-069798). In the rotary type placing head, each nozzle moves in turn to a plurality of stations set as stop positions of rotation operation in the placing head. Out of the stations, rising and falling operation is performed at a specific component holding and placing station set for holding a component from a component supplier and placing the component onto a workpiece.

In both of the related art disclosed in Japanese Patent Unexamined Publication No. 2000-294990 and Japanese Patent Unexamined Publication No. 2013-069798, a switching valve device for vacuum-suction for holding a component by means of each of the nozzles and for vacuum destruction and positive pressure application for causing a component to be detached from the nozzle is provided in each of the plurality of nozzles. The switching valve devices each are disposed on an outside of each nozzle in a placing head, and a driving mechanism that drives the switching valve devices is fixed and disposed at a position corresponding to the component holding and placing station described above where the nozzles on the outside of the placing head performs rising and falling operation. Due to such a configuration, in a state where each of the nozzles is positioned at the component holding and placing station by the rotation of the placing head, a state of each of the nozzles can be switched between any of vacuum-suction, vacuum destruction, and positive pressure application.

SUMMARY

According to the disclosure, there is provided a component placing device including a plurality of nozzles that put suction paths under a negative pressure to hold components, a plurality of nozzle shafts that hold the plurality of nozzles at lower end portions of the nozzle shafts so as to be replaced freely and each of which has an internal flow path leading to a corresponding one of the suction paths, a rotating object that holds the plurality of nozzle shafts at equal pitches on a circumference of a circle, of which center is a rotation axis, so as to rise and fall freely and that rotates about the rotation axis to move the plurality of nozzles in turn to a plurality of stations including a component holding and placing station where operation of holding the components or placing the held components at predetermined placement positions on a workpiece is performed by the plurality of nozzles and a component detecting station where detection of the components held by the plurality of nozzles is performed, a nozzle rising and falling mechanism that causes the plurality of nozzles to rise and fall at the component holding and placing station, a component detector that detects the components held by the plurality of nozzles at the component detecting station, a negative pressure flow path that is an air flow path formed inside the rotating object and leads to an external negative pressure source, a positive pressure flow path that is an air flow path formed inside the rotating object and leads to an external positive pressure source, a contact flow path that is an air flow path formed inside the rotating object and communicates with the internal flow path of each of the plurality of nozzle shafts, a flow path switcher that is internally provided in the rotating object, has a spool which moves by air for power, and causes the contact flow path to selectively communicate with the negative pressure flow path and the positive pressure flow path by movement of the spool, a first pilot flow path and a second pilot flow path, which are internally provided in the rotating object and through which air for power to drive the spool of the flow path switcher is supplied, and a communication plug for power air, which comes into contact with an exterior surface of the rotating object and through which air for power is supplied to the first pilot flow path and the second pilot flow path from the outside.

According to the disclosure, there is provided a component placing method for a component placing device that has a plurality of nozzles which put suction paths under a negative pressure to hold components, a plurality of nozzle shafts which hold the plurality of nozzles at lower end portions of the nozzle shafts so as to be freely replaceable and each of which has an internal flow path leading to a corresponding one of the suction paths, a rotating object which holds the plurality of nozzle shafts at equal pitches on a circumference of a circle, of which center is a rotation axis, so as to rise and fall freely and which rotates about the rotation axis to move the plurality of nozzles in turn to a plurality of stations including a component holding and placing station where operation of holding the components or placing the held components at predetermined placement positions on a workpiece is performed by the plurality of nozzles and a component detecting station where detection of the components held by the plurality of nozzles is performed, a negative pressure flow path which is an air flow path formed inside the rotating object and leads to an external negative pressure source, a positive pressure flow path which is an air flow path formed inside the rotating object and leads to an external positive pressure source, a contact flow path which is an air flow path formed inside the rotating object and communicates with the internal flow path of each of the plurality of nozzle shafts, a flow path switcher which is internally provided in the rotating object, has a spool which moves by air for power, and causes the contact flow path to selectively communicate with the negative pressure flow path and the positive pressure flow path by movement of the spool, a first pilot flow path, which is internally provided in the rotating object and through which air for power to move the spool to a position where the contact flow path communicates with the negative pressure flow path is sent, and a second pilot flow path, which is internally provided in the rotating object and through which air for power to move the spool to a position where the contact flow path communicates with the positive pressure flow path is sent. The method includes positioning a nozzle, out of the plurality of nozzles by rotating the rotating object at the component holding and placing station, supplying air for power to the first pilot flow path to put the suction path of the target nozzle under a negative pressure, holding the component by sucking the component by means of the nozzle target which is put under a negative pressure, moving the nozzle target to the component detecting station by rotating the rotating object, examining presence or absence of the component held by the nozzle target at the component detecting station, in a case where the component is not detected at the examination, blocking the suction path of the nozzle target from the negative pressure flow path by supplying air for power to the second pilot flow path, positioning the nozzle target at the component holding and placing station by rotating the rotating object, and placing the component held by the target nozzle by supplying air for power to the second pilot flow path to put the suction path of the nozzle target under a positive pressure from the positive pressure source.

According to the disclosure, switching between states of nozzles at a desired station in the placing head that includes the plurality of nozzles is possible, and the downsizing of facilities and cost reduction can be realized.

DETAILED DESCRIPTION

Prior to describing an embodiment, problems of the related art will be briefly described.

The related art disclosed in Japanese Patent Unexamined Publication No. 2000-294990 and Japanese Patent Unexamined Publication No. 2013-069798 has problems to be described below due to a configuration of the related art. That is, in the related art, an increase in the diameter of a placing head is avoided since a switching valve device is disposed on the outside of a nozzle in the placing head. Since a configuration where a driving mechanism for driving the switching valve device is fixed and disposed only at a position corresponding to a component holding and placing station is adopted, switching between vacuum-suction, vacuum destruction, and positive pressure application with respect to each nozzle is possible only at the component holding and placing station. Thus, optimal component holding operation cannot be realized by switching states of nozzles at other stations. In order to make switching between states of nozzles possible also at other stations, it is necessary to provide driving mechanisms for driving switching valve devices at other stations. As a consequence, the downsizing of facilities and cost reduction are hindered.

An object of the disclosure is to provide a component placing device and a component placing method, in which switching between states of nozzles is possible at a desired station in a placing head that includes a plurality of nozzles and the downsizing of facilities and cost reduction can be realized.

Next, the embodiment of the disclosure will be described with reference to the drawings. First, a structure of component placing device 1 of the embodiment will be described with reference to FIG. 1. Hereinafter, a transporting direction of a board will be defined as an X-direction, a direction orthogonal to the X-direction in a horizontal plane will be defined as a Y-direction, a direction orthogonal to a XY-plane will be defined as a Z-direction, and a direction in a horizontal plane rotating about the Z-direction as an axis will be defined as a θ-direction. Component placing device 1 has a function of holding a component by means of vacuum-suction by putting a suction hole of nozzle under a negative pressure and placing the component at a predetermined placement position on a board, which is a workpiece.

Figure 1:
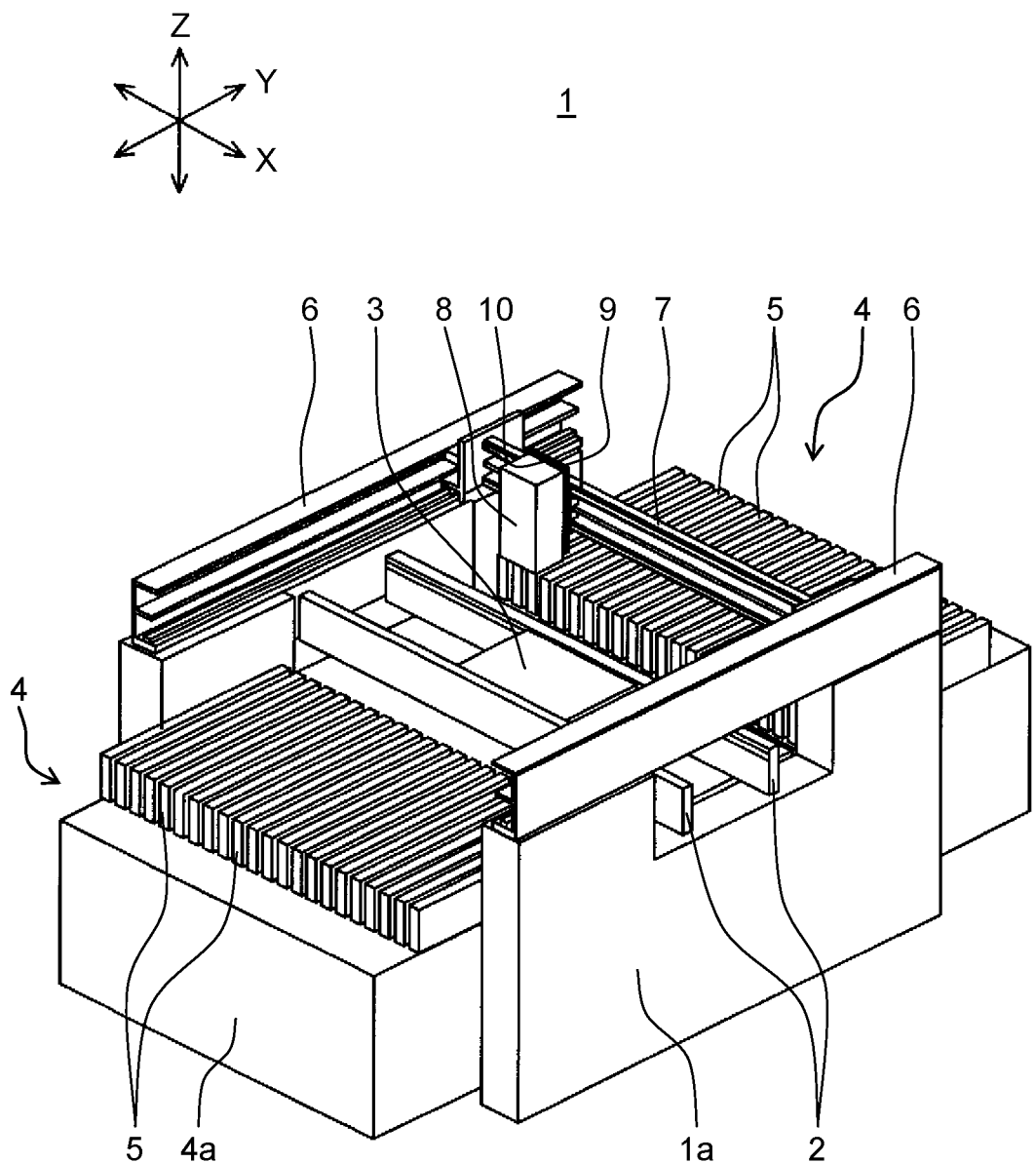
FIG. 1 is a perspective view illustrating an entire configuration of a component placing device of an embodiment of the disclosure.

In FIG. 1, board transport mechanism 2 including a pair of transport conveyors extending in the X-direction is provided in the middle of base 1a. Board transport mechanism 2 receives board 3, which is a component placement target, from an upstream side device to transport the board, and positions and holds the board at a placement work position for a component placing mechanism to be described below. Component suppliers 4 are provided on both sides of board transport mechanism 2. Component suppliers 4 each are configured such that a plurality of tape feeders 5 are arranged on feeder table 4a. Tape feeders 5 supply a component, which is a placement target, to a position for pick-up by placing head 8 of the component placing mechanism by pitch feeding carrier tape storing the component to be placed onto board 3.

Next, the component placing mechanism will be described. Y-axis tables 6 each including a linear driving mechanism are provided at end portions of base 1a in the X-direction, and X-axis table 7 including a linear driving mechanism is installed between Y-axis tables 6 so as to move freely in the Y-direction. Plate member 9 is installed on X-axis table 7 so as to move freely in the X-direction, and placing head 8 is installed on plate member 9 via holding frame 10.

Figure 2:
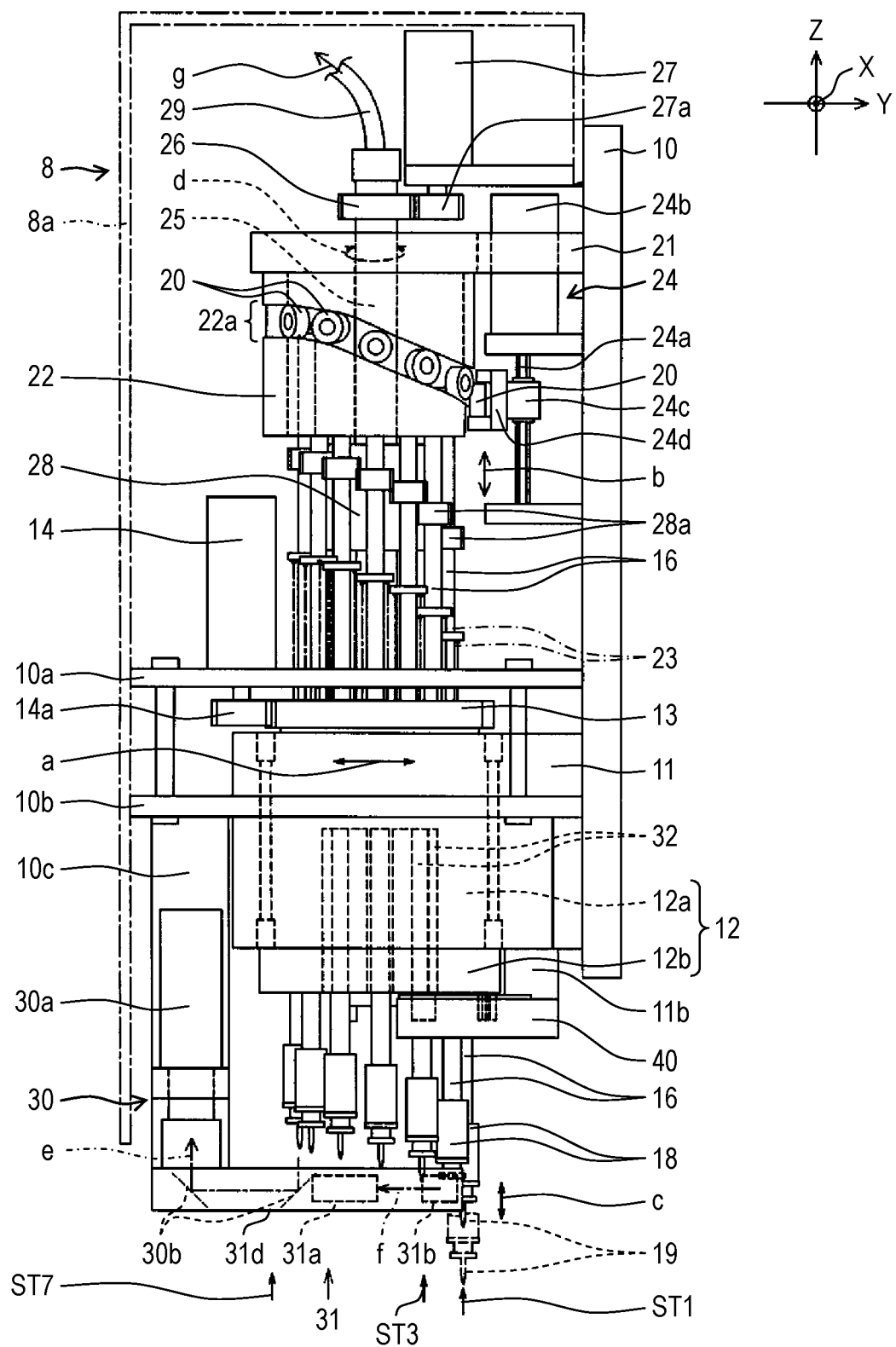
FIG. 2 is a configuration explanatory view of a placing head included in the component placing device of the embodiment of the disclosure.
Figure 3:
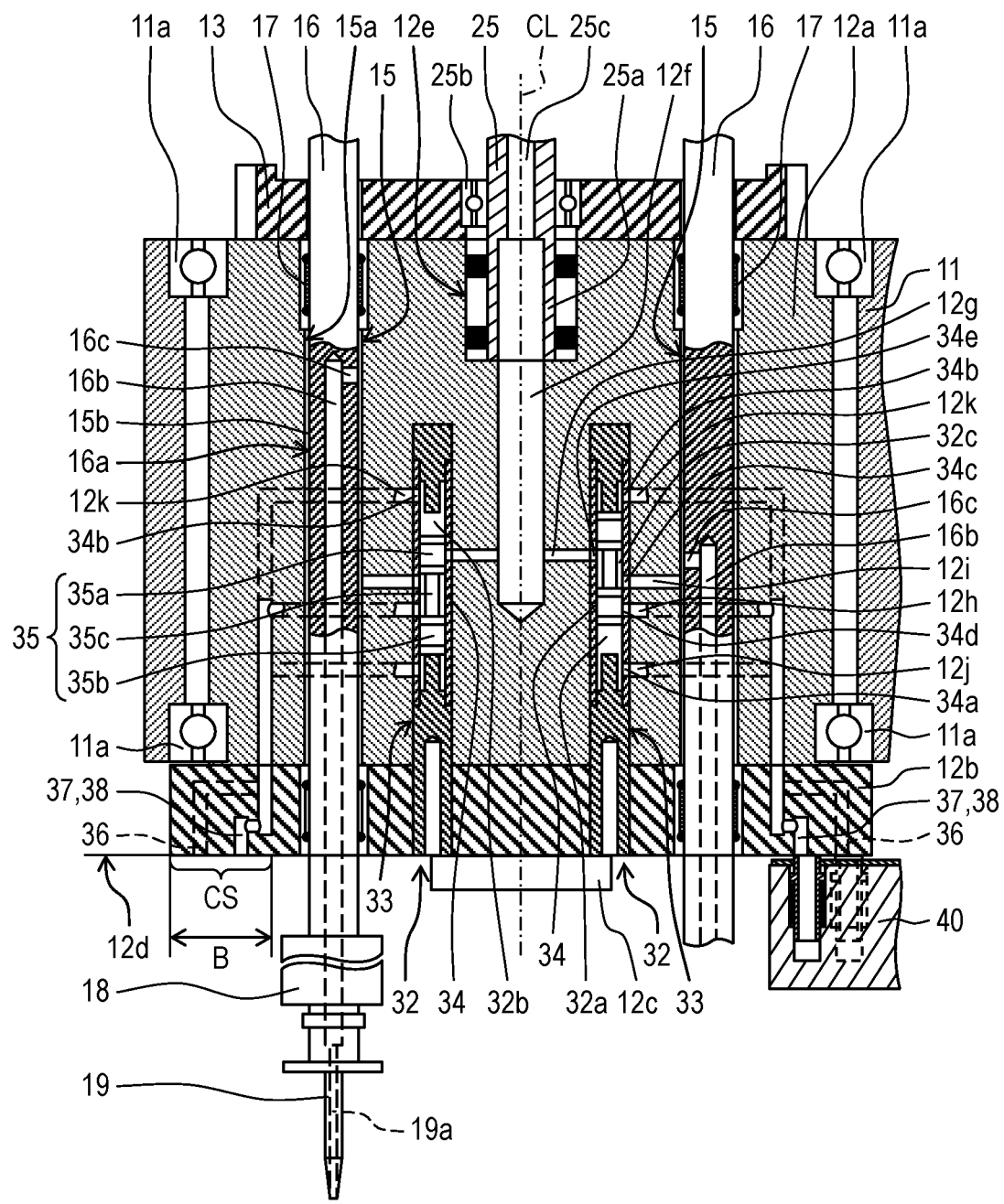
FIG. 3 is a partial sectional view of the placing head included in the component placing device of the embodiment of the disclosure.

Placing head 8 has a function of picking up and holding a component (not illustrated) to be placed onto board 3 from component suppliers 4 by means of nozzles 19 (refer to FIGS. 2 and 3). Placing head 8 horizontally moves in the X-direction and the Y-direction by Y-axis tables 6 and X-axis table 7 being driven, and places components held by nozzles 19 at predetermined placement positions on board 3, which is positioned and held by board transport mechanism 2. A suction nozzle that puts suction path 19a (refer to FIG. 3), which is opened to a tip portion, under a negative pressure generated by negative pressure source 48 (refer to FIG. 7) and holds a component is used as nozzle 19. Camera for board recognition 51a and illumination for board recognition 51b, which are not illustrated in FIG. 1, are provided in placing head 8, and the position of board 3 is recognized by camera for board recognition 51a imaging board 3 transported by board transport mechanism 2.

Next, a structure of placing head 8 will be described with reference to FIGS. 2 and 3. In FIG. 2, placing head 8 has a structure in which side surfaces and a top surface are covered with holding frame 10 and cover 8a fixed to holding frame 10. Rotating object holder 11 is provided at a lower portion of holding frame 10 so as to stretch in a horizontal direction. Cylindrical rotating object 12 is held by rotating object holder 11 so as to rotate freely about rotation axis CL, which is a shaft center in the Z-direction, via bearings 11a (refer to FIG. 3). Rotating object 12 is configured with rotating object body 12a which is pivotally supported by bearings 11a and rotating object lower portion 12b coupled to a bottom surface of rotating object body 12a.

Rotating object 12 holds a plurality of (herein, twelve) nozzle shafts 16 around the circumference of a circle, of which center is rotation axis CL, at equal pitches and nozzle shafts 16 rise and fall freely by nozzle rising and falling mechanism 24 illustrated in FIG. 2. Nozzles 19 are held by nozzle shafts 16 via nozzle holders 18 at lower end portions of the nozzle shafts respectively so as to be freely replaceable. In the embodiment, the plurality of (twelve) nozzles 19 held by nozzle shafts 16 are numbered such as nozzle No. 1 to nozzle No. 12, such that these nozzles 19 are individually identified. The nozzle No. 1 corresponds to a target nozzle in the present disclosure.

Nozzle shafts 16 each have internal flow path 16b (refer to FIG. 3) that leads to suction path 19a in a state where nozzle 19 is held. By causing internal flow paths 16b to communicate with the negative pressure source, suction paths 19a of nozzles 19 come under a negative pressure and tip portions of nozzles 19 hold components by means of vacuum-suction. In addition, by blocking internal flow paths 16b from the negative pressure source, a vacuum within suction paths 19a is destroyed and vacuum-suction of components by the tip portions of nozzles 19 is released. By causing internal flow paths 16b to communicate with positive pressure source, a positive pressure is applied to suction paths 19a of nozzles 19 and components are detached from the tip portions of nozzles 19 by blowing of air.

By rotating object 12 rotating about rotation axis CL, the plurality of nozzles 19 held by nozzle shafts 16 move, in turn, to nozzle stop stations at twelve positions (refer to ST1 to ST12 illustrated in FIG. 5), which are stop positions of nozzles 19 in index rotation of rotating object 12. The nozzle stop stations include component holding and placing station ST1 where operation of holding component P or placing held component P onto a predetermined placement position on board 3, which is a workpiece, is performed by each of nozzles 19, component detecting station ST3 where component detector 31 detects component P held by each of nozzles 19, and component recognizing station ST7 where component P held by each of nozzles 19 is recognized.

The index rotation operation of rotating object 12 described above is performed by a driving mechanism to be described below. Holding body follower gear 13, of which shaft center is rotation axis CL, is fixed to the top surface of rotating object 12. Above rotating object holder 11, index motor 14 is provided on upper shelf member 10a provided so as to stretch from holding frame 10 in a lateral direction. Index driving gear 14a that meshes with holding body follower gear 13 is placed in index motor 14. Holding body follower gear 13 is driven via index driving gear 14a by driving index motor 14, and accordingly, rotating object 12 index rotates with holding body follower gear 13 (arrow a).

Manifold 40 held by coupling member 11b fixed to rotating object holder 11 is provided on a bottom surface of rotating object lower portion 12b. Communication plugs for air 42 (refer to FIG. 4) that communicate with positive pressure source 46 (refer to FIG. 7) are provided in manifold 40, and communication plugs for air 42 are provided so as to come into sliding contact with contact surface CS, which is the bottom surface of rotating object lower portion 12b. Due to such a configuration, in the index rotation of rotating object 12 described above, it is possible for a positive pressure air from positive pressure source 46 to be supplied through communication plugs for air 42 to air flow paths formed inside rotating object 12 via an opening for positive pressure air supply provided in contact surface CS of rotating object 12 (refer to FIG. 3) so as to correspond to each of nozzle shafts 16.

In FIG. 2, at an upper portion of holding frame 10, cam holder 21 fixing cylindrical cam 22 is provided so as to stretch in the horizontal direction. Guide groove 22a is provided in an outer circumferential surface of cylindrical cam 22. Guide groove 22a is provided such that a side of the guide groove opposite to holding frame 10 is high and the height of the guide groove gradually becomes lower as approaching holding frame 10. Cam follower 20 fitted to the top of each of nozzle shafts 16 is joined to cylindrical cam 22 such that the cam follower can move along guide groove 22a.

When rotating object 12 index rotates, nozzle shafts 16 circle in response to the index rotation in the horizontal direction and move up and down along guide groove 22a of cylindrical cam 22. At this time, nozzle shafts 16 are in a state of being biased upwards by spring members 23 provided on the top surface of rotating object 12. A part of cylindrical cam 22 where guide groove 22a is the lowest is cut out, and guide groove 22a ends at the cut place.

Nozzle rising and falling mechanism 24 is provided between holding frame 10 and cylindrical cam 22. Nozzle rising and falling mechanism 24 is configured with screw shaft 24a extending in the Z-direction, Z-axis motor 24b that rotationally drives screw shaft 24a, and nut 24c that is screwed with screw shaft 24a. Cam follower holder 24d that can rise and fall along the cut place of cylindrical cam 22 is provided in nut 24c. Cam follower holder 24d rises and falls with nut 24c by the driving of Z-axis motor 24b. Cam follower holder 24d has a shape of complementing guide groove 22a ended at the cut place.

Cam followers 20 that have moved along guide groove 22a run off guide groove 22a at this position, and transfer to and are held by cam follower holder 24d which stands by at a position having the same height as guide groove 22a. By driving Z-axis motor 24b in this state, cam follower holder 24d rise and fall with cam followers 20 (arrow b).

The tops of nozzle shafts 16 are coupled to cam followers 20 via joints (not illustrated) so as to rotate freely. Due to this configuration, when cam followers 20 rise and fall, nozzle shafts 16 coupled to the joints rise and fall and nozzles 19 held by nozzle holders 18, which are the lower end portions of nozzle shafts 16, rise and fall (arrow c). That is, at the position of nozzle shaft 16 where cam follower holder 24d holds cam follower 20, there is component holding and placing station ST1 where nozzle shaft 16 rises and falls to suck and pick up a component with nozzle 19 and to place the held component onto board 3.

Cylindrical rotation shaft 25 penetrating cylindrical cam 22 up and down is provided so as to rotate relatively and freely with respect to cylindrical cam 22. As illustrated in FIG. 3, lower end portion 25a of rotation shaft 25 is fitted into fitting hole 12e provided, with rotation axis CL as the center, in an upper portion of rotating object 12 via bearings 25b and rotates freely with respect to rotating object 12. Rotation shaft inner hole 25c penetrating up and down to rotating object 12 is formed inside rotation shaft 25, and a lower end portion of rotation shaft inner hole 25c communicates with negative pressure flow path 12f provided inside rotating object 12. An upper end portion of rotation shaft 25 is connected to negative pressure source 48 via suction tube 29, and accordingly, the inside of negative pressure flow path 12f can be vacuum-sucked (arrow g) via rotation shaft inner hole 25c.

Each of a plurality of flow path switchers 32 corresponding to each of nozzle shafts 16 is provided inside rotating object 12 (also refer to FIG. 3). Flow path switchers 32 are spool valve type switching valves, have a function of selectively connecting suction paths 19a of nozzles 19 installed in nozzle shafts 16 to negative pressure flow paths 12g leading to negative pressure source 48 or positive pressure flow paths 12h leading to positive pressure source 46, both of which are air flow paths formed inside rotating object 12. That is, in a case where suction paths 19a of nozzles 19 are connected to negative pressure source 48, flow path switchers 32 communicate with rotation shaft inner hole 25c and put the suction paths under a negative pressure. In a case where suction paths 19a of nozzles 19 are connected to positive pressure source 46, flow path switchers 32 communicate with communication plugs for air 42 of manifold 40.

In the embodiment, flow path switcher 32 having the function described above switches suction path 19a of nozzle 19 to a state connected to positive pressure flow path 12h from a state connected to negative pressure flow path 12g and put suction path 19a under a positive pressure to cause a component to be detached from this nozzle 19 during component placement, and connects suction path 19a to negative pressure flow path 12g to put the suction path under a negative pressure before component detector 31 performs detection of a take-away component, in which a component at the tip of nozzle 19 is detected. By forcibly putting suction paths 19a of nozzles 19 after component placement under a negative pressure in this manner, take-away components can be prevented from being accidentally dropped.

In a case where a take-away component is not detected at nozzle 19, which has placed a component, by component detector 31, flow path switcher 32 is configured so as to block suction path 19a of this nozzle 19 from negative pressure flow path 12g by connecting this suction path 19a to positive pressure flow path 12h. Accordingly, a vacuum can be prevented from needlessly leaking from nozzle 19 without a take-away component.

θ-rotation follower gear 26 of which shaft center is rotation axis CL is fixed to a vicinity of the upper end portion of rotation shaft 25. θ-axis motor 27 coupled to θ-rotation driving gear 27a meshing with θ-rotation follower gear 26 is disposed above cylindrical cam 22. θ-rotation follower gear 26 rotates in the θ-direction via θ-rotation driving gear 27a by the driving of θ-axis motor 27. Accordingly, rotation shaft 25 rotates in the θ-direction with θ-rotation follower gear 26 (arrow d).

Between rotating object 12 and cylindrical cam 22, nozzle driving gear 28 having a shape of spreading in an up-and-down direction so as to correspond to rising and falling strokes of nozzle shafts 16 is coupled to rotation shaft 25. Nozzle rotation gear 28a is coupled to each of nozzle shafts 16 at a position where each nozzle shaft meshes with nozzle driving gear 28. Each of nozzle shafts 16 rotates simultaneously in the θ-direction via nozzle rotation gear 28a by the driving of nozzle driving gear 28. In this manner, nozzle shafts 16 rotate in the θ-direction by the driving of θ-axis motor 27, and accordingly, nozzles 19 held by nozzle holders 18 which are the lower end portions of nozzle shafts 16 rotate as well in the θ-direction.

Lower shelf member 10b stretching from holding frame 10 in the lateral direction is provided below upper shelf member 10a, and component recognizer 30 is provided in holding bracket 10c stretching downwards from an end portion of lower shelf member 10b. Component detector 31 is provided in lens barrel 31d, which stretches from a lower end portion of holding bracket 10c in the horizontal direction and is held by the bracket. At a timing when nozzle 19, which is at the lower end portion of nozzle shaft 16 held by rotating object 12, is positioned at component recognizing station ST7 by the index rotation of rotating object 12, component recognizer 30 has a function of imaging component P that is in a state of being held by this nozzle 19 from below.

That is, mirrors 30b are provided in lens barrel 31d at component recognizing station ST7 and below camera for component recognition 30a, respectively. By illumination for component recognition 30c (refer to FIG. 8) emitting illumination light to a component held by nozzle 19 positioned at component recognizing station ST7 and mirrors 30b leading (arrow e) the reflected illumination light to camera for component recognition 30a, an image of the component held by nozzle 19 is acquired. By recognition-processing the acquired images, component identification and a positional shift state are recognized. When placing a component onto board 3, placement position correction is performed on the position of nozzle shaft 16 in placing head 8 in the θ-direction and an XY-direction position determined by the component placing mechanism by taking into account component recognition results from component recognizer 30.

Component detector 31 has a function of detecting component P at the tip of nozzle 19 which is at component detecting station ST3. An optical sensor optically detecting a component, such as a light detecting device, a CCD, and a CMOS, is used as component detector 31. In an example in the embodiment, component detector 31 is configured with side camera 31a, mirrors 31b, and illumination for a side camera 31c (refer to FIG. 6), which are disposed in the lens barrel 31d, and side camera 31a images the tip portion of nozzle 19 positioned at component detecting station ST3.

Figure 6:
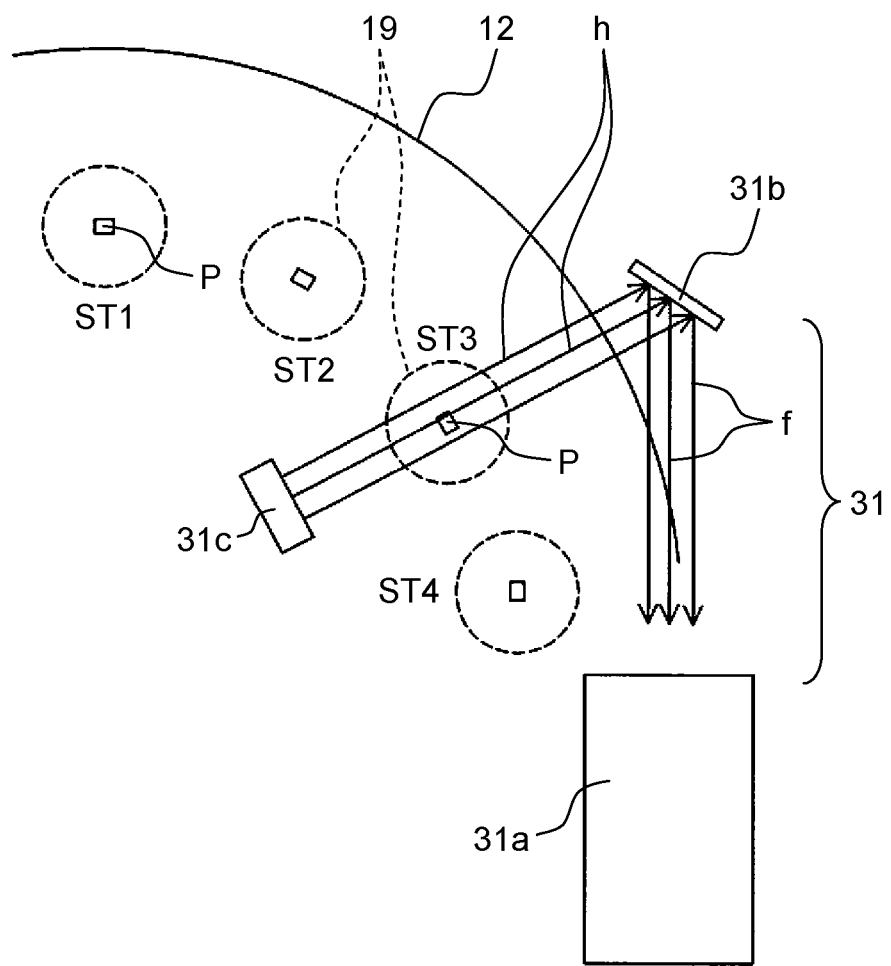
FIG. 6 is an explanatory view of component detection at a component detecting station of the placing head included in the component placing device of the embodiment of the disclosure.

That is, as illustrated in FIG. 6, illumination for a side camera 31c and mirror 31b are disposed such that nozzle 19 positioned at component detecting station ST3 is interposed between the illumination for a side camera and the mirror. Side camera 31a receives reflected light (arrow f), which is obtained by mirror 31b reflecting illumination light (arrow h) that is emitted from illumination for a side camera 31c and that is transmitted through nozzle 19, to image a component. By component posture detection processor 50*f* of controller 50 (refer to FIG. 8) recognition-processing the imaging results, the presence or absence of component P held by nozzle 19 at component detecting station ST3 and the posture of component P held by nozzle 19 can be detected.

In the embodiment, after placing head 8 moves on board 3 held by board transport mechanism 2 and places component P held by each of nozzles 19 on board 3, take-away components at the tips of nozzles 19 are detected by means of the function of component detector 31. In a case where a take-away component is detected by component detector 31, the component is discarded at a predetermined component collection position set in a movement route of placing head 8 in component placing device 1.

Figure 5:
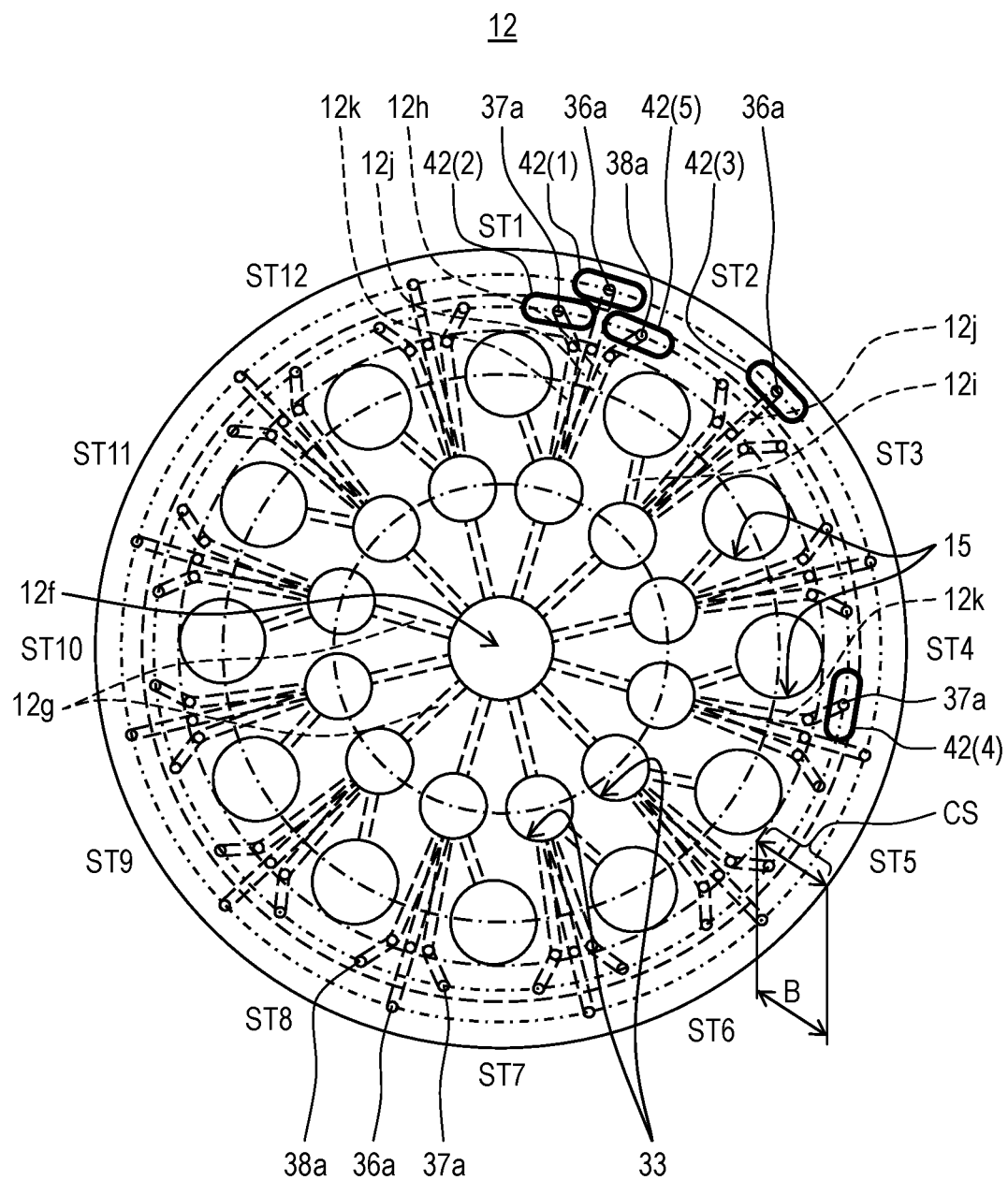
FIG. 5 is a horizontal sectional view illustrating disposition of an air flow path inside a rotating object of the placing head included in the component placing device of the embodiment of the disclosure.

Next, air flow paths formed inside rotating object 12 of placing head 8 and a suction and exhaust system formed of the air flow paths will be described with reference to FIGS. 3 and 5. FIG. 5 schematically illustrates a horizontal section of rotating object 12 illustrated in FIG. 3. As illustrated in FIG. 3, nozzle shafts 16 in rotating object 12 are inserted in nozzle shaft holding holes 15 provided by penetrating rotating object 12 up and down.

As illustrated in FIG. 5, the plurality of nozzle shaft holding holes 15 for holding the plurality of (herein, twelve) nozzle shafts 16 are formed at equal pitches on the circumference of a circle, of which center is rotation axis CL and which is concentric to rotating object 12. The inner diameters of nozzle shaft holding holes 15 are set so as to be longer than the outer diameters of nozzle shafts 16. In a state where nozzle shafts 16 are inserted in nozzle shaft holding holes 15, cavities 15*b*, which allow the flow of air, is formed between inner circumferential surfaces 15*a* of nozzle shaft holding holes 15 and outer circumferential surfaces 16*a* of nozzle shafts 16. Bearings 17 are provided at both upper and lower end portions of each of nozzle shaft holding holes 15, and nozzle shafts 16 are airtightly meshed with bearings 17 so as to slide freely. Accordingly, it is possible for nozzle shafts 16 to rise, fall, and rotate about an axis in a state where cavities 15*b* are sealed from the outside.

Openings 16*c*, which are open to outer circumferential surfaces 16*a* of nozzle shafts 16 and communicate with cavities 15*b*, are provided at positions of being interposed between two upper and lower bearings 17 above internal flow paths 16*b* provided inside nozzle shafts 16. Openings 16*c* each are positioned within the area of cavity 15*b* that is interposed between two upper and lower bearings 17 even when nozzle shaft 16 move up and down. Negative pressure flow path 12*f* communicating with negative pressure source 48 is provided inside rotating object 12 in a longitudinal direction along rotation axis CL via rotation shaft inner hole 25*c* and suction tube 29 (refer to FIG. 2). Between negative pressure flow path 12*f* and nozzle shaft holding holes 15, cylindrical flow path switchers 32 in valve holding holes 33 are disposed on the circumference of a concentric circle so as to correspond to each of nozzle shaft holding holes 15. Flow path switchers 32 penetrate rotating object lower portion 12*b* from below, are inserted in valve holding holes 33, and are fixed to rotating object 12 by valve holding member 12*c* fastened to bottom surface 12*d* of rotating object lower portion 12*b*. By disposing flow path switchers 32 on an inner peripheral side of nozzle shafts 16 in rotating object 12 in this manner, it is possible to configure rotary type placing head 8 in a small size.

Flow path switchers 32 each include valve cylinder 34 in the middle. Valve cylinders 34 each are a tubular member having a mesh hole inside for meshing with spool 35 so as to slide freely up and down. Spools 35 each have upper piston 35*a* that meshes with valve cylinder 34, lower piston 35*b*, and connecting rod 35*c* that connects upper piston 35*a* and lower piston 35*b* together. By spools 35 rising and upper pistons 35*a* being positioned upwards (one end side), first spaces 32*a* are formed below lower pistons 35*b* (the other end side) (refer to flow path switcher 32 on the right in FIG. 3).

By spools 35 falling and lower pistons 35*b* being positioned downwards (the other end side), second spaces 32*b* are formed above upper pistons 35*a* (one end side) (refer to flow path switcher 32 on the left in FIG. 3). Connecting spaces 32*c* between upper pistons 35*a* and lower pistons 35*b* move within valve cylinders 34 as spools 35 move up and down.

First drive ports 34*a*, second drive ports 34*b*, contact ports 34*c*, positive pressure ports 34*d*, and negative pressure ports 34*e*, which are connection ports allowing the internal spaces (first spaces 32*a*, second spaces 32*b*, and connecting spaces 32*c*) of flow path switchers 32 to communicate with the below air flow paths formed inside rotating object 12, are provided in valve cylinders 34.

The air flow paths include negative pressure flow paths 12*f* and 12*g* leading to an external negative pressure source, the plurality of positive pressure flow paths 12*h* leading to an external positive pressure source, and a plurality of contact flow paths 12*i* communicating with internal flow paths 16*b* of nozzle shafts 16. A plurality of first pilot flow paths 12*j* and a plurality of second pilot flow paths 12*k*, through which air for power to drive spools 35 of flow path switchers 32 is supplied, are internally provided in rotating object 12 as air flow paths.

By driving and moving spools 35 up and down by air for power supplied via first pilot flow paths 12*j* and second pilot flow paths 12*k*, flow path switchers 32 cause contact flow paths 12*i* to selectively communicate with negative pressure flow paths 12*g* or positive pressure flow paths 12*h*. Herein, air for power to drive each spool 35 is supplied from the outside to first pilot flow paths 12*j* and second pilot flow paths 12*k* via at least two communication plugs for air 42, that is, first communication plug for power air 42 (1) and second communication plug for power air 42 (2), out of the plurality of communication plugs for air 42 (refer to FIG. 4) that come into contact with an exterior surface (herein, contact surface CS set on the outer edge of bottom surface 12*d* of rotating object lower portion 12*b*) of rotating object 12 (refer to first communication plug for power air 42 (1) to communication plug for positive pressure air 42 (5) illustrated in FIG. 5).

Details of the supply of air for power and functions of flow path switchers 32 will be described. As illustrated in FIG. 3, flat ring-shaped contact surface CS (also refer to FIG. 5) having predetermined width B in a radial direction when seen from rotation axis CL, that is an annulation of which center is rotation axis CL, is provided on the outer edge of bottom surface 12*d* of rotating object lower portion 12*b*. First air flow paths 36, second air flow paths 37, and third air flow paths 38, which communicate with each of inlets of first pilot flow paths 12*j*, second pilot flow paths 12*k*, and positive pressure flow paths 12*h*, that is, first pilot flow paths 12*j*, second pilot flow paths 12*k*, and positive pressure flow paths 12*h*, and are provided in rotating object lower portion 12*b*. A plurality of first openings 36*a*, second openings 37*a*, and third openings 38*a*, which are open to contact surface CS, are disposed in contact surface CS so as to correspond to each of flow path switchers 32.

Figure 4:
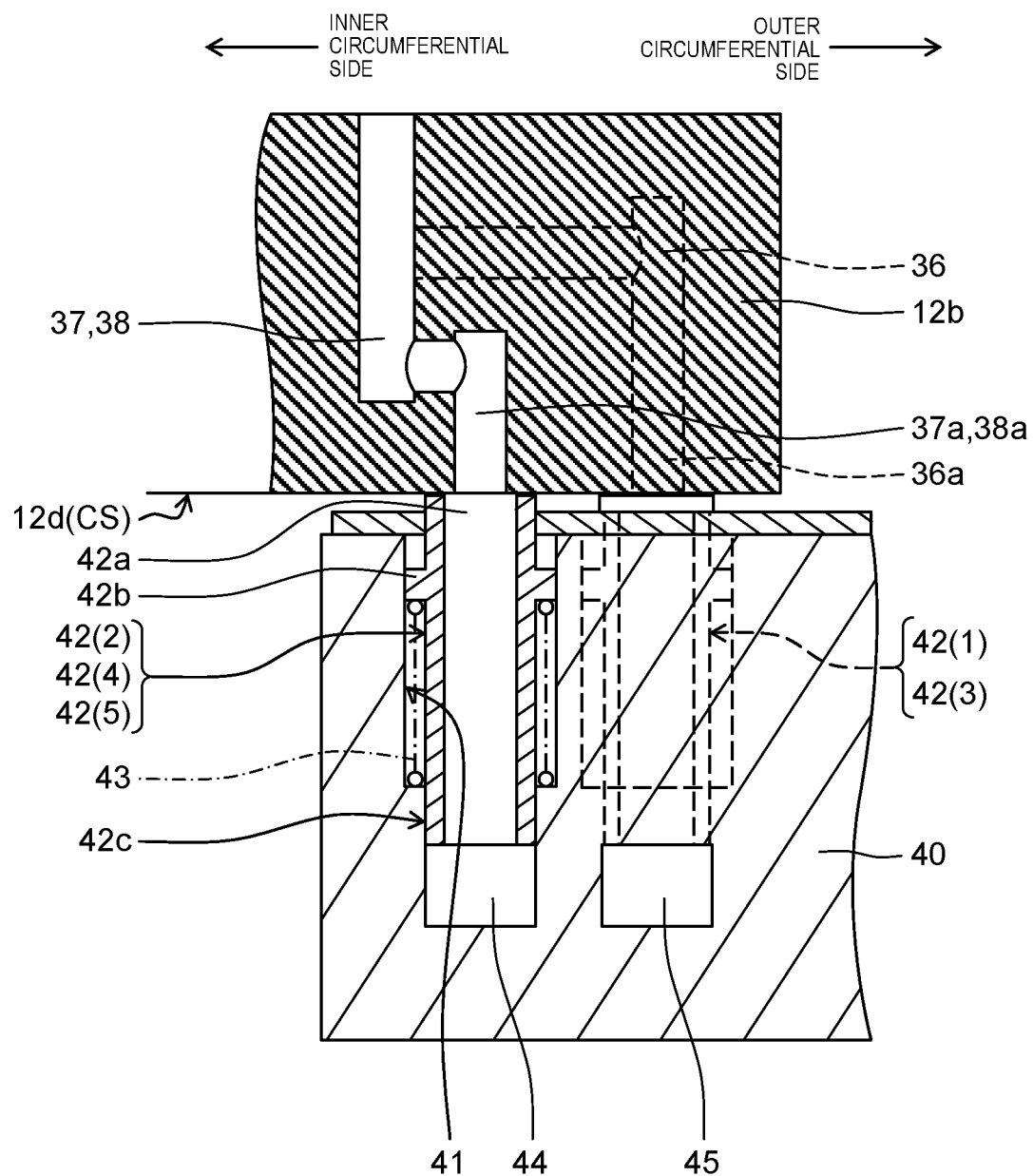
FIG. 4 is a sectional view of a manifold through which an air pressure is supplied to the placing head included in the component placing device of the embodiment of the disclosure.

A structure and a function of communication plugs for air 42 will be described with reference to FIG. 4. In FIG. 4, bottom surface 12d, which is the outer edge of rotating object lower portion 12b, is contact surface CS, with which communication plugs for air 42 come into contact and which communicates with air flow paths of rotating object 12. First openings 36a open to first air flow paths 36 communicating with first pilot flow paths 12j are disposed on an outer circumferential side of contact surface CS, and second openings 37a and third openings 38a open to second air flow paths 37 and third air flow paths 38 communicating with second pilot flow paths 12k and positive pressure flow paths 12h are disposed on an inner circumferential side of contact surface CS.

Manifold 40, in which the plurality of communication plugs for air 42 that come into contact with contact surface CS are installed, is provided below rotating object lower portion 12b. First communication plug for power air 42 (1) and third communication plug for power air 42 (3) are installed at positions corresponding to first openings 36a on the outer circumferential side, and second communication plug for power air 42 (2), fourth communication plug for power air 42 (4), and communication plug for positive pressure air 42 (5) are installed at positions corresponding to second openings 37a and third opening 38a on the inner circumferential side.

Each of communication plugs for air 42 has air supply opening 42a at a contact portion with contact surface CS, and is a hollow member having flange 42b that engages with stepped engaging hole 41 provided in manifold 40 and shaft 42c. Flanges 42b are biased upwards by spring members 43 installed in engaging hole 41, and accordingly, upper end portions of communication plugs for air 42 come into sliding contact with contact surface CS.

First air flow path 44 and second air flow path 45, through which an air pressure is supplied to each of communication plugs for air 42 and which are connected to positive pressure source 46, are provided in manifold 40. As for a shape and a size, each of air supply openings 42a is set so as to have an oval shape sufficient to include first opening 36a, second opening 37a, and third opening 38a, and is made such that a communication state can be ensured from a time point immediately before communication plug for air 42 reaches a target position.

First communication plug for power air 42 (1) communicates with first pilot flow path 12j via first air flow path 36 from first opening 36a in a state of being in contact with contact surface CS, and second communication plug for power air 42 (2) communicates with second pilot flow path 12k via second air flow path 37 from second opening 37a in a state of being in contact with contact surface CS. As described above, flow path switchers 32 each have first space 32a provided on one end side of spool 35 and second space 32b provided on the other end side, and contact flow path 12i communicates with negative pressure flow path 12g when spool 35 has moved to the other end side by air for power supplied to first space 32a. Contact flow path 12i communicates with positive pressure flow path 12h when spool 35 has moved to one end portion by air for power supplied to second space 32b.

That is, first pilot flow paths 12j internally provided in rotating object 12 have a function of sending air for power to move spools 35 to positions where contact flow paths 12i communicate with negative pressure flow paths 12g, and second pilot flow paths 12k have a function of sending air for power to move spools 35 to positions where contact flow paths 12i communicate with positive pressure flow paths 12h. In other words, by supplying air for power from first air flow paths 36 to first drive ports 34a, a state where spools 35 rise and first spaces 32a are formed is caused. By supplying air for power from second air flow paths 37 to second drive ports 34b, a state where spools 35 fall and second spaces 32b are formed is caused. In the operation of flow path switchers 32, first pilot flow paths 12j communicate with first spaces 32a and second pilot flow paths 12k communicate with second spaces 32b.

Contact ports 34c communicate with contact flow paths 12i. Contact flow paths 12i are open to inner circumferential surfaces 15a of nozzle shaft holding holes 15 and communicate with cavities 15b. At this time, contact ports 34c are in a state of communicating with connecting spaces 32c at all times regardless of which position spools 35 are at, out of a risen position and a fallen position. Accordingly, cavities 15b communicate with connecting spaces 32c at all times.

Positive pressure ports 34d communicate with positive pressure flow paths 12h, and positive pressure flow paths 12h communicate with third air flow paths 38 for supplying a positive pressure, which are formed in rotating object lower portion 12b. When positive pressure air is supplied from third air flow paths 38 to positive pressure ports 34d in a state where spools 35 have fallen, positive pressure air is supplied into contact ports 34c. Accordingly, positive pressure air is supplied to internal flow path 16b via contact flow paths 12i, cavities 15b, and openings 16c.

On the other hand, in a state where spools 35 have risen, positive pressure ports 34d are closed by lower pistons 35b, and the supply of positive pressure air is blocked. Along with this, negative pressure flow paths 12g, which communicate with negative pressure ports 34e, come into a state of communicating with connecting spaces 32c. In this state, by putting negative pressure flow path 12f under a negative pressure, internal flow paths 16b are put under a negative pressure via negative pressure flow path 12g, contact ports 34c, contact flow paths 12i, cavities 15b, and openings 16c.

Herein, the disposition of first openings 36a, second openings 37a, third openings 38a, and communication plugs for air 42 corresponding to each nozzle stop station ST in rotating object 12 will be described with reference to FIG. 5. In FIG. 5, the illustration of manifold 40 in which communication plugs for air 42 are provided is omitted. As illustrated in FIG. 5, twelve nozzle stop stations ST (component holding and placing station ST1 to twelfth station) where nozzles 19 stop in the index rotation of rotating object 12 are set in placing head 8.

First opening 36a, second opening 37a, and third opening 38a are disposed so as to correspond to nozzle shaft holding hole 15 and flow path switcher 32, which are positioned at each nozzle stop station ST in rotating object 12. The openings are disposed in a triangle with first opening 36a, which is on the outer circumferential side, being as the apex and a line binding second opening 37a and third opening 38a on the inner circumferential side together being as the base.

At positions of first opening 36a, second opening 37a, and third opening 38a, which correspond to component holding and placing station ST1, first communication plug for power air 42 (1), second communication plug for power air 42 (2), and communication plug for positive pressure air 42 (5) are disposed respectively in manifold 40. First communication plug for power air 42 (1) communicates with first pilot flow path 12j from first opening 36a in a state of being in contact with contact surface CS at component holding and placing station ST1, and second communication plug for power air 42 (2) communicates with second pilot flow path 12k from second opening 37a in a state of being in contact with contact surface CS at component holding and placing station ST1.

Communication plug for positive pressure air 42 (5) communicates with positive pressure flow path 12h from third opening 38a in a state of being in contact with contact surface CS at component holding and placing station ST1. In a case where nozzle 19 performs component placement operation and a case where nozzle 19 discards a component at component holding and placing station ST1, positive pressure air is supplied to positive pressure flow path 12h through communication plug for positive pressure air 42 (5) in order to put suction path 19a of this nozzle 19 under a positive pressure and accelerate detachment of the component.

Third communication plug for power air 42 (3) that communicates with first pilot flow path 12j from first opening 36a is disposed in manifold 40 at the position of first opening 36a corresponding to one (second nozzle stop station ST2 which is after component holding and placing station ST1 in an example given herein) of nozzle stop stations ST before component detecting station ST3, which is nozzle stop station ST after component holding and placing station ST1. Before nozzle 19, which has performed component placement operation at component holding and placing station ST1, reaches component detecting station ST3, air for power is supplied to first pilot flow path 12j through third communication plug for power air 42 (3) in order to put suction path 19a of this nozzle 19 under a negative pressure.

That is, there is at least one nozzle stop station ST between component holding and placing station ST1 and component detecting station ST3. Before the plurality of nozzles 19, which have finished component placement at nozzle stop station ST next to component holding and placing station ST1, reach component detecting station ST3, flow path switchers 32 connect the plurality of suction paths 19a of these nozzles 19 to negative pressure flow paths 12g. By forcibly putting suction paths 19a of nozzles 19 after component placement under a negative pressure in this manner, take-away components can be prevented from being accidentally dropped.

Fourth communication plug for power air 42 (4) that communicates with second pilot flow path 12k from second opening 37a is disposed in manifold 40 at the position of second opening 37a corresponding to component detecting station ST3 or nozzle stop station ST after component detecting station ST3. In a case where a component is not detected at component detecting station ST3, air for power is supplied to second pilot flow path 12k through fourth communication plug for power air 42 (4) in order to destroy the vacuum of suction path 19a of these nozzles 19.

That is, in a case where a take-away component is not detected at nozzle 19, which have placed a component, by component detector 31, flow path switcher 32 blocks suction path 19a from negative pressure flow path 12g by connecting suction path 19a of this nozzle 19 to positive pressure flow path 12h at component detecting station ST3 or the next nozzle stop station ST. Accordingly, a vacuum can be prevented from needlessly leaking from nozzle 19 without a take-away component.

Figure 7:
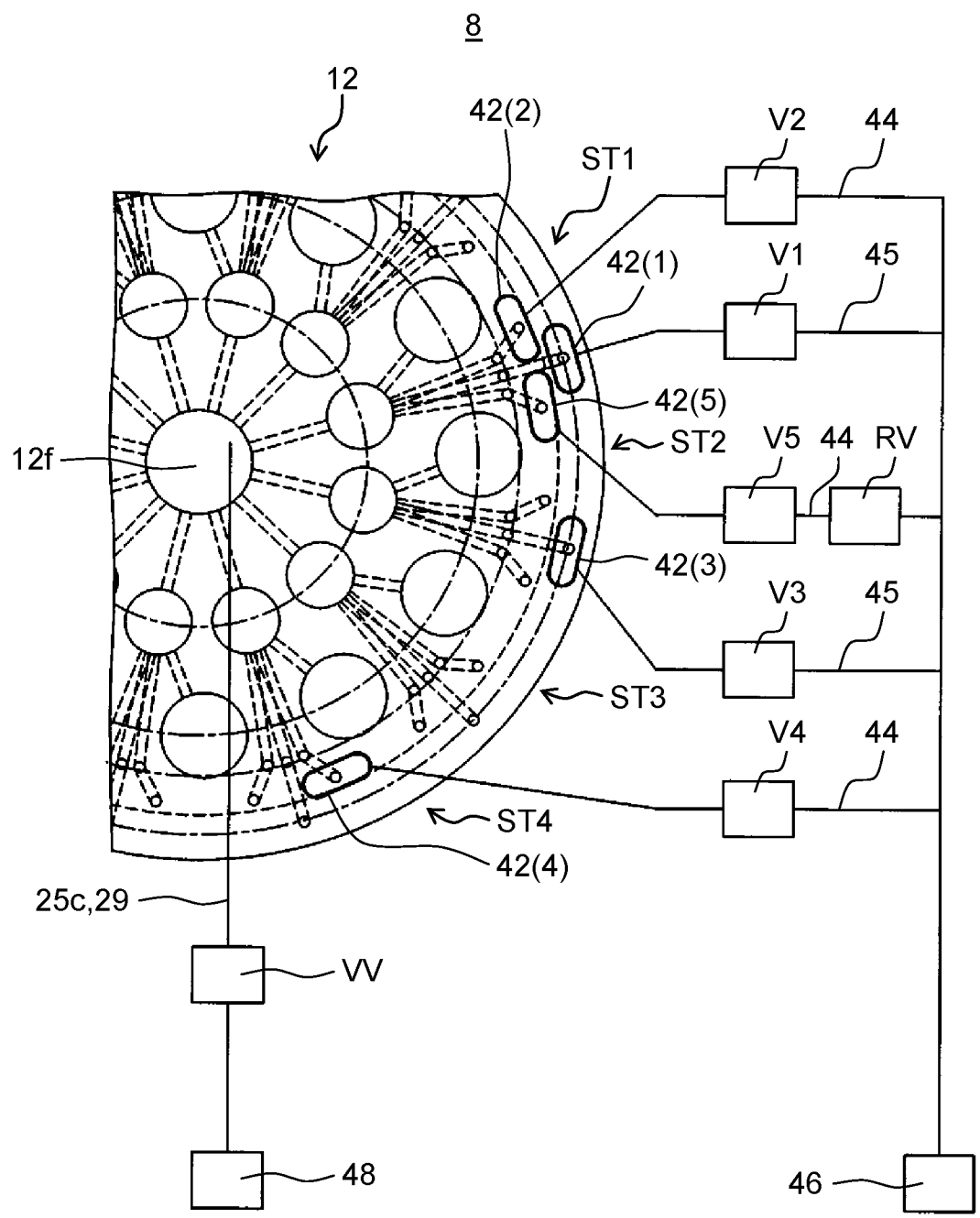
FIG. 7 is a configuration explanatory view of a positive pressure supply system and a vacuum exhaust system in the placing head included in the component placing device of the embodiment of the disclosure.

Next, configurations of a positive pressure supply system and a vacuum exhaust system in placing head 8 will be described with reference to FIG. 7. Negative pressure flow path 12f formed inside rotating object 12 is connected to negative pressure source 48 via an exhaust route including rotation shaft inner hole 25c and suction tube 29 (refer to FIG. 2). Vacuum opening/closing valve VV is provided in the exhaust route. By opening and closing vacuum opening/closing valve VV, putting of negative pressure flow path 12f under a negative pressure by negative pressure source 48 can be turned on/off. In a device operational state, vacuum opening/closing valve VV is in an open state, and negative pressure flow paths 12f and 12g are in a state where a negative pressure is applied at all times.

Second communication plug for power air 42 (2), first communication plug for power air 42 (1), and communication plug for positive pressure air 42 (5), which are disposed at component holding and placing station ST1, are connected to positive pressure source 46 via first air flow path 44, second air flow path 45, and first air flow path 44, respectively. Second opening/closing valve V2, first opening/closing valve V1, and fifth opening/closing valve V5 are provided in first air flow path 44, second air flow path 45, and first air flow path 44, respectively. Pressure reducing valve RV is provided in first air flow path 44 leading to fifth opening/closing valve V5.

By opening and closing second opening/closing valve V2, first opening/closing valve V1, and fifth opening/closing valve V5, the supply of air for power to second communication plug for power air 42 (2) and first communication plug for power air 42 (1) and the supply of positive pressure air for blowing to communication plug for positive pressure air 42 (5) can be turned on/off. In the supply of positive pressure air, the supply pressure of the positive pressure air can be regulated so as to be at a desired pressure value (for example, 0.01 MPa) by regulating pressure reducing valve RV.

Third communication plug for power air 42 (3) disposed at second nozzle stop station ST2 is connected to positive pressure source 46 via second air flow path 45. Third opening/closing valve V3 is provided in second air flow path 45. By opening and closing third opening/closing valve V3, the supply of air for power to third communication plug for power air 42 (3) can be turned on/off. Fourth communication plug for power air 42 (4) disposed at fourth nozzle stop station ST4 is connected to positive pressure source 46 via first air flow path 44. Fourth opening/closing valve V4 is provided in first air flow path 44. By opening and closing fourth opening/closing valve V4, the supply of air for power to fourth communication plug for power air 42 (4) can be turned on/off.

Figure 8:
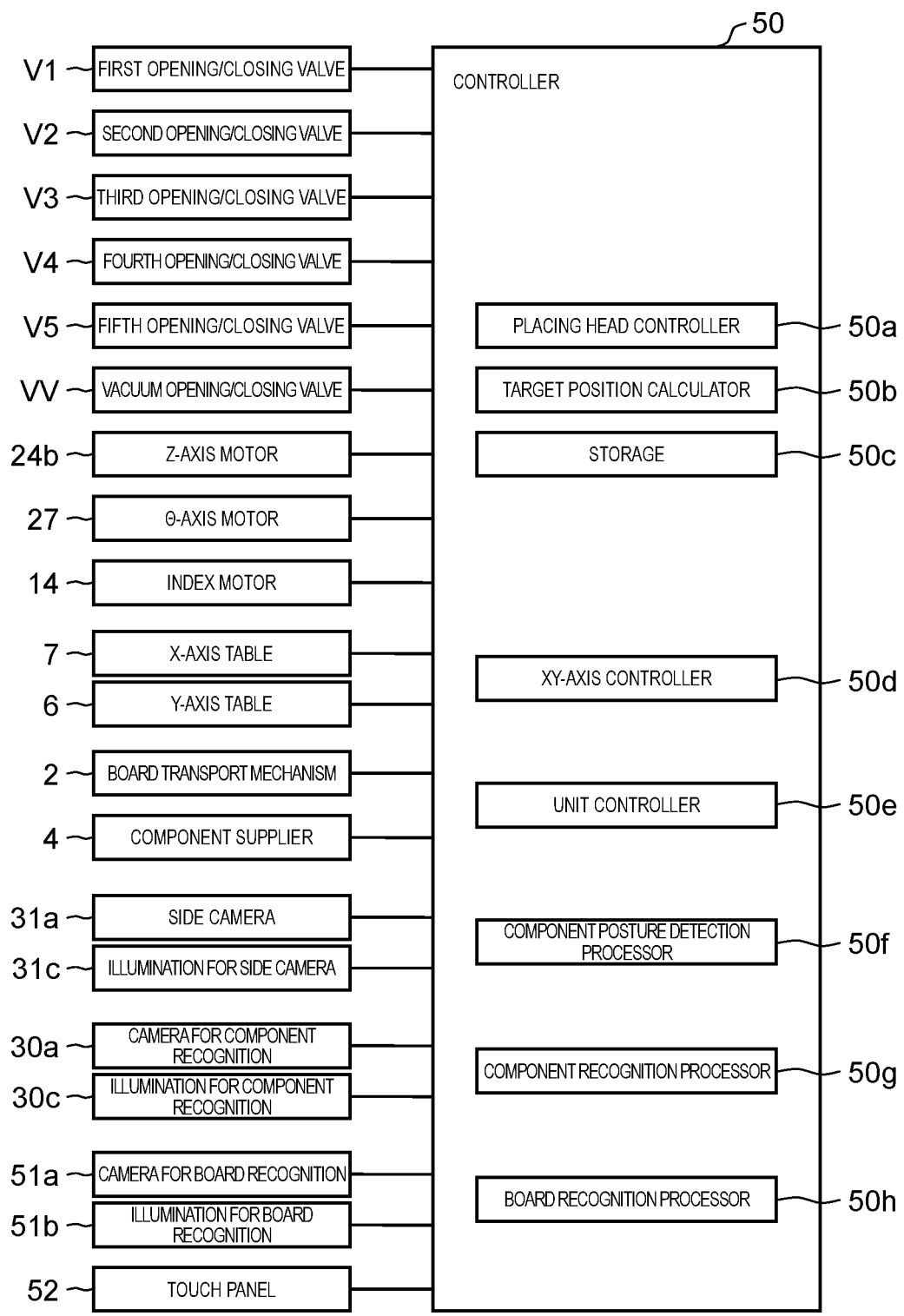
FIG. 8 is a block diagram showing a configuration of a control system of the component placing device of the embodiment of the disclosure.

Next, a configuration of a control system of component placing device 1 will be described with reference to FIG. 8. In FIG. 8, below control target elements, which are targets for control or input, are connected to controller 50 that controls all devices of component placing device 1. The control target elements include first opening/closing valve V1 to fifth opening/closing valve V5, vacuum opening/closing valve VV, Z-axis motor 24b, θ-axis motor 27, index motor 14, X-axis table 7, Y-axis tables 6, board transport mechanism 2, component suppliers 4, side camera 31a, illumination for a side camera 31c, camera for component recognition 30a, illumination for component recognition 30c, camera for board recognition 51a, illumination for board recognition 51b, and touch panel 52. Touch panel 52 has a function of displaying a guide screen and the like at the time of operational input in control processing by controller 50.

As control processing functions to control the control target elements, placing head controller 50a, target position calculator 50b, storage 50c, XY-axis controller 50d, unit controller 50e, component posture detection processor 50f, component recognition processor 50g, and board recognition processor 50h are provided in controller 50.

Placing head controller 50a controls operation of component holding and component placement by nozzles 19 in placing head 8 by controlling first opening/closing valve V1 to fifth opening/closing valve V5, vacuum opening/closing valve VV, nozzle rising and falling mechanism 24, θ-axis motor 27, and index motor 14, which are provided in placing head 8. That is, by placing head controller 50a controlling first opening/closing valve V1 to fifth opening/closing valve V5, and vacuum opening/closing valve VV, air for power, air for positive pressure blowing, and a negative pressure are supplied to air flow paths formed inside rotating object 12 of placing head 8 via communication plugs for air 42 disposed in manifold 40 or the supply is blocked at a predetermined timing according to an operation state of nozzle 19 specified in advance.

Target position calculator 50b performs processing of calculating a target position when placing a component held by nozzle 19 of placing head 8 onto board 3 positioned by board transport mechanism 2. In the processing, component recognition results and board recognition results acquired based on imaging results from camera for component recognition 30a and camera for board recognition 51a are referred to.

Storage 50c stores various types of data necessary for placing head 8 to execute component placement operation, such as mounting data prepared for each type of board 3, that is, the type of component, which is a mounting target, a mounting position on board 3, and a nozzle to be used in placing. Storage 50c temporarily saves component posture detection results and component recognition results from component posture detection processor 50f and component recognition processor 50g to be described below so as to correspond to individual nozzles 19 in placing head 8, that is, nozzle numbers assigned to nozzles 19.

By XY-axis controller 50d controlling X-axis table 7 and Y-axis tables 6, placing head 8 is moved to a predetermined position in component placement operation. Unit controller 50e controls mechanism units related to component mounting operation, such as board transport mechanism 2 and component suppliers 4. Component posture detection processor 50f controls side camera 31a and illumination for a side camera 31c, and performs processing of detecting the presence or absence of a component at the tip of nozzle 19 and the correctness of a component posture by recognition-processing imaging results from side camera 31a.

Component recognition processor 50g controls camera for component recognition 30a and illumination for component recognition 30c, and performs processing of the position of a component which is in a state of being held by nozzle 19 by recognition-processing imaging results from camera for component recognition 30a. Board recognition processor 50h controls camera for board recognition 51a and illumination for board recognition 51b, and performs processing of detecting the position of board 3 positioned by board transport mechanism 2 by recognition-processing imaging results from camera for board recognition 51a.

Next, component placing processing (component placing method) executed by component placing device 1 will be described with reference to FIG. 9. First, when component placing work is initiated, board bringing-in is executed (S1). That is, board 3 brought into board transport mechanism 2 from an upstream side device is positioned by board transport mechanism 2 at a placement work position. Next, board recognition is executed (S2). That is, by board recognition processor 50h recognition-processing imaging results obtained by camera for board recognition 51a imaging board 3, the position of board 3 is recognized.

Next, a placing head component holding step is executed (S3). Herein, operation of the plurality of (herein, twelve) nozzles 19 included in placing head 8 picking up components from component suppliers 4 is executed. That is, component holding operation of positioning nozzles 19 (nozzle No. 1 to nozzle No. 12) at component holding and placing station ST1 in turn by rotating rotating object 12 is performed. The rotation of rotating object 12 is stopped at a time point when rotating object 12 rotates once and all nozzles 19 have completed component holding operation.

Next, a placing head component placing step is executed (S4). Herein, operating of moving placing head 8 holding components by means of each of nozzles 19 above board 3 positioned by board transport mechanism 2, causing the plurality of nozzles 19 holding the components to fall, and placing the components at predetermined placement positions specified for each component is executed in turn. That is, component placement operation of moving each of nozzles 19 (nozzle No. 1 to nozzle No. 12) to component holding and placing station ST1 in turn by rotating rotating object 12 is performed. Predetermined processing including the detection of the presence or absence of a take-away component is executed for each of nozzles 19 at second nozzle stop station ST2 to fourth nozzle stop station ST4.

Next, the presence of a take-away component is determined based on detection results of the presence or absence of a take-away component described above (S5). In a case where it is determined that there is a take-away component, component discarding processing is executed (S6). That is, nozzle 19 where the take-away component is detected is positioned at component holding and placing station ST1 and placing head 8 is moved to a predetermined component collection position. Positive pressure air is supplied to suction path 19a of this nozzle 19, and the take-away component is detached and discarded. In the component discarding processing, also an abnormal posture component, of which suction state by a tip of nozzle 19 in placing head component holding step (S3) is determined as abnormal and thereby placement onto board 3 is skipped, is a discarding target along with a take-away component.

When (S6) is completed, and when it is determined that there is no take-away component in (S5), the presence of a non-placed component is determined (S7). Herein, in a case where there is a non-placed component, processing returns to (S3) and subsequent processing is repeatedly executed. Component placing processing, of which target is board 3, is completed since it is determined that there is no non-placed component in (S7), and board bringing-out is executed (S8).

Processing executed on each of nozzles 19 at component holding and placing station ST1 to component recognizing station ST7 in placing head component holding step described above will be described with reference to FIG. 10. Although only one nozzle 19 (herein, the nozzle No. 1) out of the plurality of nozzles 19 included in placing head 8 is described herein, the same processing is also executed in turn on other nozzles 19 (nozzle No. 2 to nozzle No. 12).

First, rotating object 12 in placing head 8 is rotated and the nozzle No. 1, out of the plurality of nozzles 19, is positioned at component holding and placing station ST1. It is determined that whether or not this nozzle No. 1 is a work target nozzle (S11). In a case where this nozzle No. 1 is an unsuitable nozzle that cannot be used for unknown reasons, or in a case where a placement target component is not allocated on mounting data stored in storage 50c, it is determined that the nozzle is not a target. In this case, processing is skipped (S14).

In a case where the nozzle is determined as a target in (S11), component holding operation is performed on the nozzle No. 1. That is, air for power is supplied to first pilot flow path 12j to put suction path 19a of the nozzle No. 1 under a negative pressure, and the nozzle No. 1 is brought into a vacuum-on state (S12). In this state, the nozzle No. 1 is caused to rise and fall (S13), and the nozzle No. 1 which is put under a negative pressure sucks and holds a component from component suppliers 4.

After then, rotating object 12 is rotated to move the nozzle No. 1 holding the component to component detecting station ST3, and at this time, checking of a suction state is executed by component detector 31 (S31). At this time, by component posture detection processor 50f recognition-processing imaging results obtained by side camera 31a included in component detector 31 imaging the tip of nozzle 19, the presence or absence of the component held by the nozzle No. 1 is examined and it is checked that whether or not the posture of the held component is normal. The suction state checked results are transmitted to storage 50c and are saved in association with this nozzle 19 (S32). In the component discarding processing described in (S6), the component determined as an abnormal posture component based on the saved checked results is a discarding target.

Next, when the nozzle No. 1 moves to fourth nozzle stop station ST4, the absence of a component at the tip of nozzle 19 is determined (S41) based on the suction state checked results obtained at component detecting station ST3. In a case where there is no component, vacuum destruction is performed on nozzle 19 which has been brought into a vacuum-on state at component holding and placing station ST1 (S42). That is, in a case where a component is not detected in the examination at component detecting station ST3, air for power is supplied to second pilot flow path 12k and suction path 19a of the nozzle No. 1 is blocked from negative pressure flow path 12g. Accordingly, vacuum-suction by nozzle 19 that does not hold a component stops, and thereby a vacuum can be prevented from needlessly leaking.

In a case where it is determined that there is a component in (S41), processing is skipped in order to maintain the state of vacuum-on (S43). Even in a case where the component is determined as an abnormal posture component, which is a sucked component having a posture that is not normal, the state of vacuum-on is maintained until component discarding processing to prevent the detachment of the component. After then, when the nozzle No. 1 moves to component recognizing station ST7, component recognition is executed by component recognizer 30 (S71), the component held by the nozzle No. 1 is imaged by camera for component recognition 30a so as to be recognition-processed by component recognition processor 50g. The component recognition results are transmitted to storage 50c and are saved in association with this nozzle 19 (S72).

Next, processing executed at each of nozzle stop stations ST in the placing head component placing step described above will be described with reference to FIG. 11. Although only one nozzle 19 (herein, the nozzle No. 1) out of the plurality of nozzles 19 included in placing head 8 is described herein as in FIG. 10, the same processing is also executed in turn on other nozzles 19 (nozzle No. 2 to nozzle No. 12).

First, rotating object 12 in placing head 8 is rotated and the nozzle No. 1 is positioned at component holding and placing station ST1. The feasibility of placement operation on the nozzle No. 1 is determined (S101). In a case where the nozzle No. 1 is not a component placement target, or in a case where placement operation is not feasible for reasons such as an abnormal suction state, processing at this station is skipped (S105).

In a case where placement operation is feasible in (S101), the nozzle No. 1 holding a component is caused to fall (S102) and vacuum destruction and blowing of air are performed on the nozzle No. 1 (S103). Accordingly, the component held by the nozzle No. 1 is detached so as to be placed at a placement position on board 3. That is, air for power is supplied to second pilot flow path 12k to put suction path 19a of the nozzle No. 1 under a positive pressure from positive pressure source 46, and the component held by the nozzle No. 1 is placed. After then, the nozzle No. 1 which has placed the component is caused to rise (S104).

After the component held by the nozzle No. 1 is placed, the nozzle No. 1 is moved to second nozzle stop station ST2 and the nozzle No. 1 is forcibly brought into a vacuum-on state (S201). That is, air for power is supplied to first pilot flow path 12j to put suction path 19a of the nozzle No. 1 under a negative pressure. Accordingly, even in a case where there is a take-away component, which remains in a state of being attached to the nozzle No. 1 without being normally detached from the nozzle in component placement operation, a state where the take-away component is held by the nozzle No. 1 is maintained. Consequently, a defect caused by a take-away component being dropped and attached to board 3, which is a product, or device mechanism portions can be prevented.

Next, rotating object 12 is rotated to move the nozzle No. 1 to component detecting station ST3. The detection of a take-away component is performed by component detector 31 at component detecting station ST3 (S301), and the results are transmitted and saved. That is, it is examined that whether a component, which has not been detached normally from the tip of the nozzle No. 1 in component placement operation, is left, and examination results are saved in storage 50c in association with the nozzle No. 1.

After then, the nozzle No. 1 moves to fourth nozzle stop station ST4, and the absence of a take-away component is determined (S401). In a case where there is a take-away component, processing at the station is skipped (S403). Accordingly, vacuum-suction by the nozzle No. 1 is maintained until component discarding processing of (S6), and the drop of the take-away component is prevented. In a case where there is no take-away component in (S401), vacuum destruction is executed on the nozzle No. 1 (S402). That is, in a case where a component is not detected in the examination at component detecting station ST3, air for power is supplied to second pilot flow path 12k and suction path 19a of the nozzle No. 1 is blocked from negative pressure flow path 12g. The vacuum destruction is performed in order to prevent a vacuum from needlessly leaking due to the continuation of vacuum-suction by nozzle 19 without a component.

In a case where a component is not detected from the examination performed at component detecting station ST3, the component discarding processing (S6) described above is executed. In the component discarding processing, placing head 8 is moved to a predetermined component collection position, and rotating object 12 is rotated to position the nozzle No. 1, which is a component discarding target, at component holding and placing station ST1. At this time, air for power is supplied to second pilot flow path 12k to block suction path 19a of the nozzle No. 1 from negative pressure flow path 12g, and suction path 19a is put under a positive pressure from positive pressure source 46 to discard the component left at the nozzle No. 1 at a predetermined component collection position.

Figure 9:
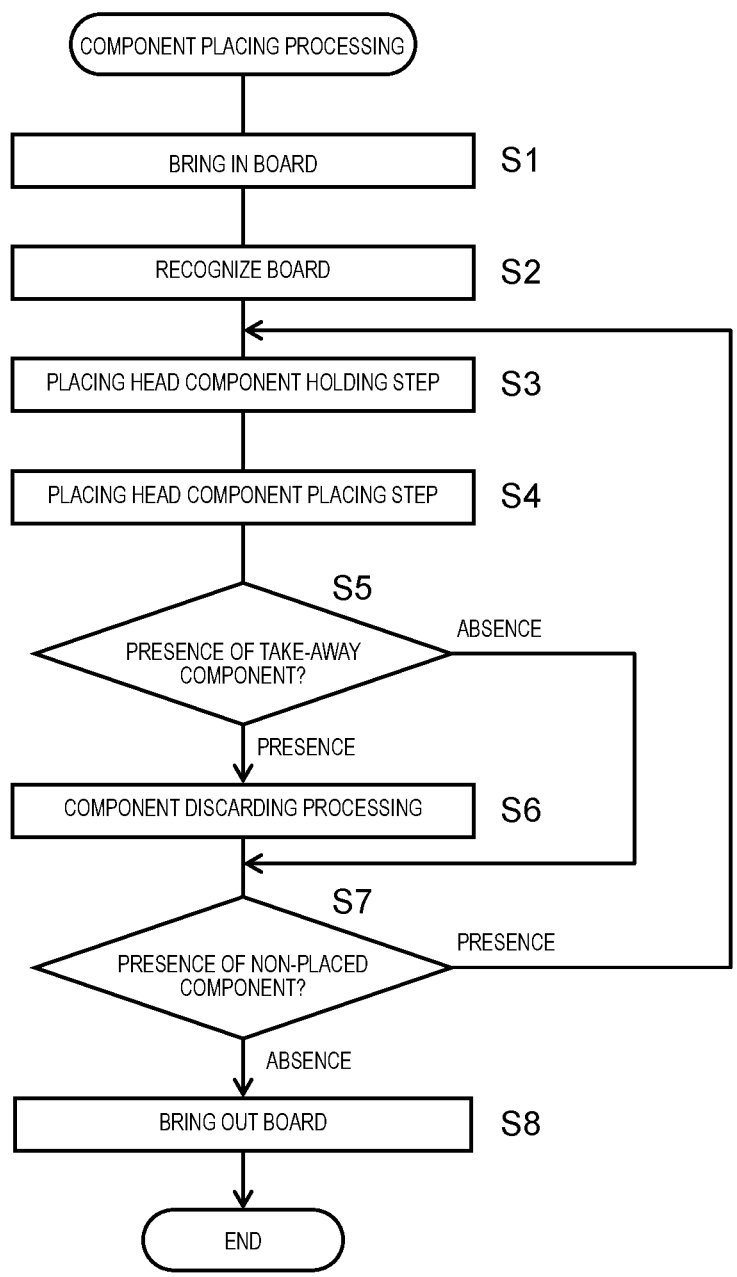
FIG. 9 is a flow chart of component placing processing in the component placing device of the embodiment of the disclosure.
Figure 10:
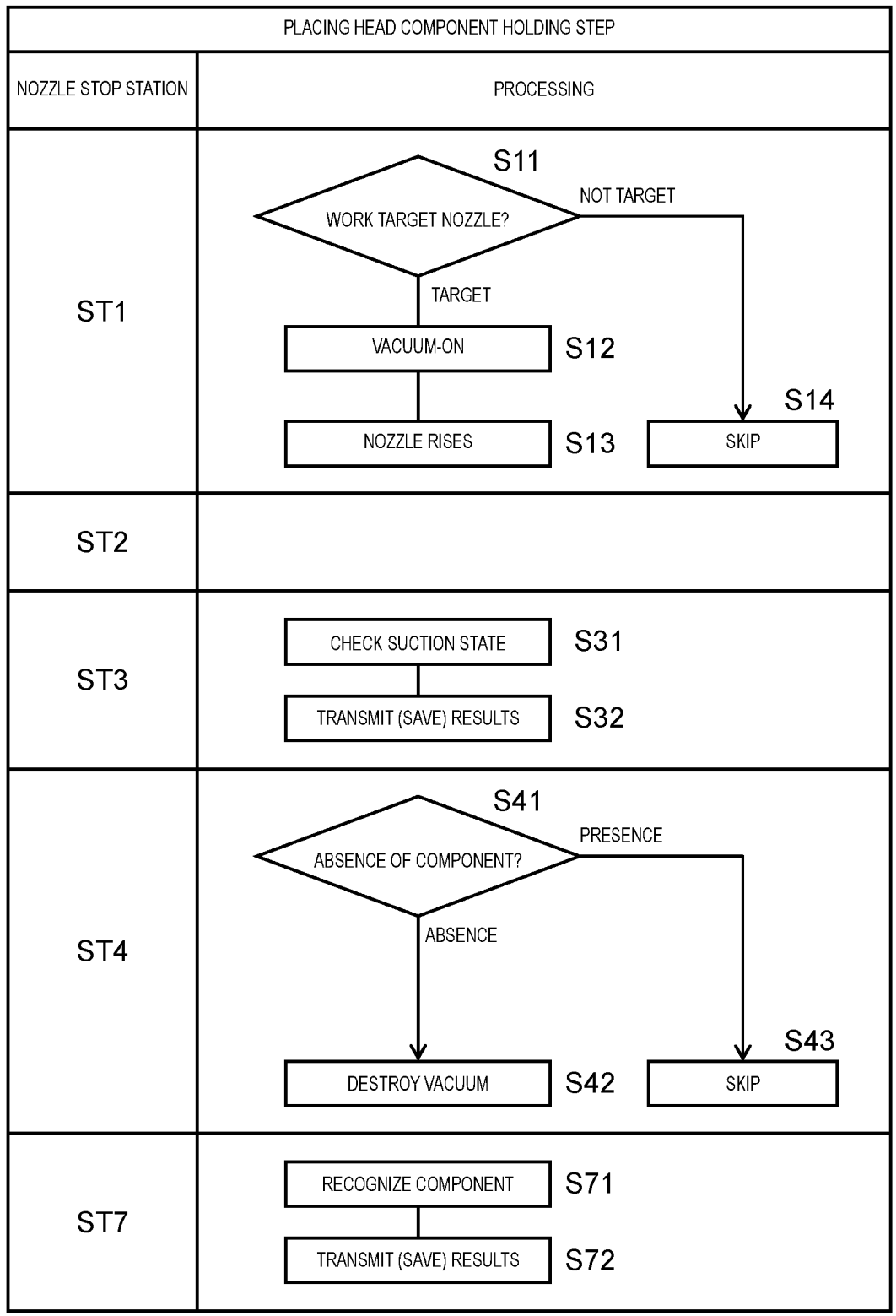
FIG. 10 is a flow chart showing work processing of a placing head component holding step in a component placing method of the embodiment of the disclosure.
Figure 11:
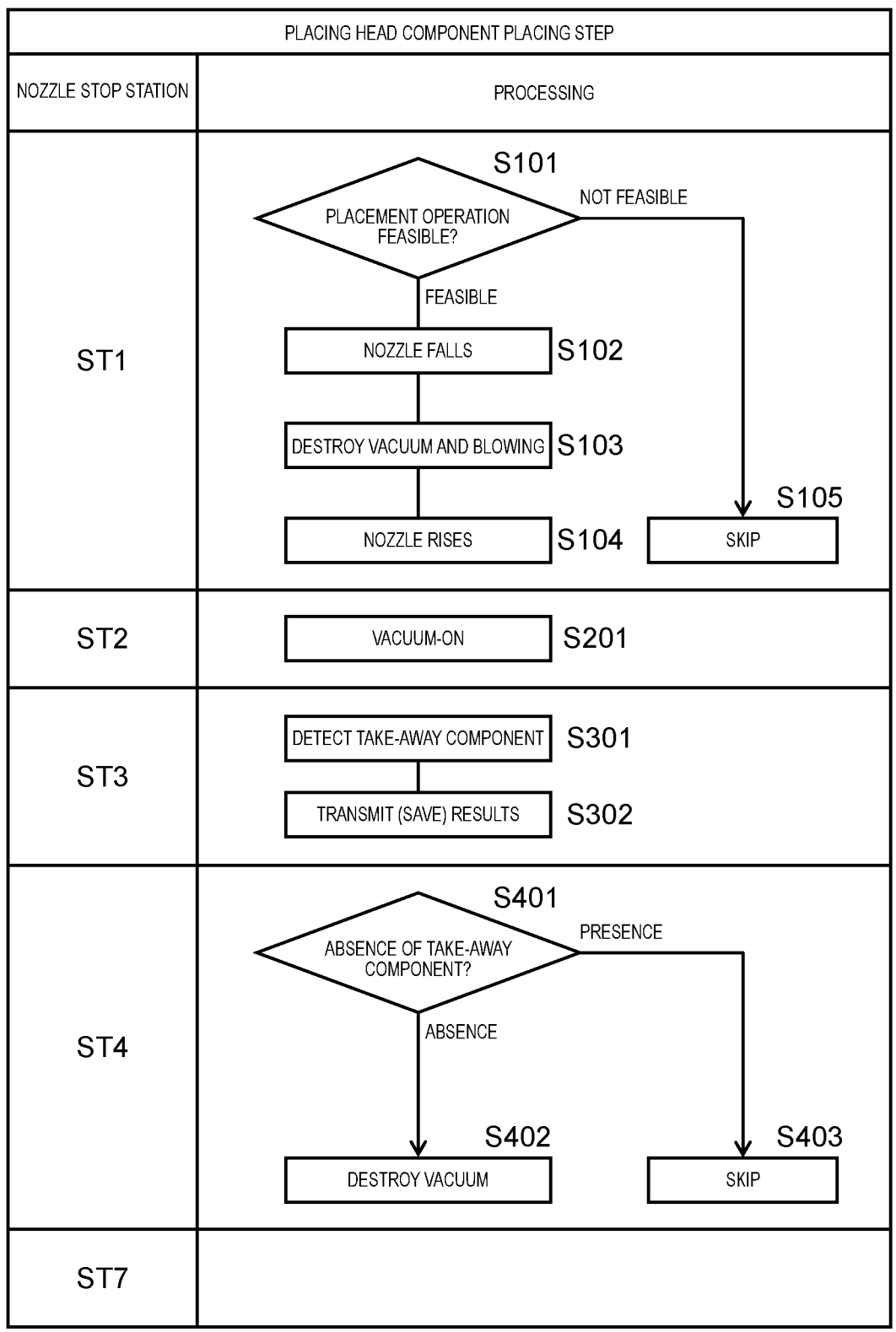
FIG. 11 is a flow chart showing work processing of a placing head component placing step in the component placing method of the embodiment of the disclosure.

The component placing processing shown in FIGS. 9, 10, and 11 is a component placing method for component placing device 1 having the configuration described above. The component placing method is configured so as to include operation steps to be described below. That is, in the component placing method, first, the plurality of nozzles 19 are moved in turn to component holding and placing station ST1, and the plurality of suction paths 19a of nozzles 19 are put under a negative pressure such that components are held by the plurality of nozzles 19. Next, the plurality of nozzles 19 are moved in turn to component holding and placing station ST1 and component detecting station ST3, the plurality of suction paths 19a of nozzles 19 are put under a positive pressure at component holding and placing station ST1 to cause components to be detached from the plurality of nozzles 19, and the plurality of components are placed at the plurality of predetermined placement positions on board 3, which is a workpiece.

Next, component detector 31 examines the plurality of nozzles 19 for the presence or absence of take-away components attached to nozzles 19 after component placement at component detecting station ST3. In a case where a take-away component is detected, the component is discarded at a predetermined component collection position. Before the plurality of nozzles 19, which have finished the placement of components at component holding and placing station ST1, reach component detecting station ST3, the plurality of suction paths 19a of nozzles 19 are put under a negative pressure.

That is, there is at least one nozzle stop station ST between component holding and placing station ST1 and component detecting station ST3, and flow path switchers 32 put the plurality of suction paths 19a of nozzles 19, which have finished the placement of components, under a negative pressure at nozzle stop station ST next to component holding and placing station ST1. In a case where take-away components are not detected at nozzles 19 after component placement by component detector 31, flow path switchers 32 block the putting of suction paths 19a of these nozzles 19 under a negative pressure at component holding and placing station ST1 or the next nozzle stop station ST.

Although an example, in which a rotary type head having a configuration where nozzles 19 are moved in turn to the plurality of nozzle stop stations by rotating rotating object 12 including the plurality of nozzles 19 is used as placing head 8, is given in the embodiment described above, the disclosure is not limited to such a configuration. For example, the disclosure can be applied even in a case where a component placing device configured so as to have one or the plurality of nozzles 19, to include flow path switchers 32 corresponding to individual nozzles 19 and component detector 31 that detects components at nozzles 19, and to discard take-away components at a predetermined component collection position in a case where the take-away components attached to nozzles 19 after component placement are detected by component detector 31 is used.

The component placing method for the component placing device is a component placing method, in which suction paths 19a of nozzles 19 are put under a negative pressure to hold components, suction paths 19a of nozzles 19 are put under a positive pressure to cause the components to be detached from nozzles 19 and to be placed at predetermined placement positions on board 3, which is a workpiece, take-away components attached to nozzles 19, which have placed the components, are detected by component detector 31, and in a case where take-away components are detected, the components are discarded at a predetermined component collection position. Before the detection of take-away components is performed by component detector 31, suction paths 19a are put under a negative pressure. In a case where take-away components are not detected at nozzles 19 after component placement by component detector 31, the putting of suction paths 19a of these nozzles 19 under a negative pressure is blocked. The same effects as in the example described above are obtained with such a configuration.

As described above, the component placing device of the embodiment is a component placing device having a configuration where the plurality of nozzle shafts 16 are moved in turn to the plurality of nozzle stop stations ST, including component holding and placing station ST1 and component detecting station ST3, by rotating rotating object 12, in which the plurality of nozzle shafts 16 having nozzles 19 holding components by means of a negative pressure at lower end portions of the nozzle shafts are installed, about a rotation axis. A configuration where flow path switchers 32, which selectively connect suction paths 19a of nozzles 19 to positive pressure flow paths leading to a positive pressure source and to negative pressure flow paths leading to a negative pressure source by movement of internally provided spools 35, are disposed on insides of nozzle shafts 16, and air for power to drive spools 35 is supplied to rotating object 12 via manifold 40, in which communication plugs for power air that come into contact with the exterior surface of rotating object 12 are provided at the plurality of desired nozzle stop stations ST, is adopted.

Accordingly, it is possible to perform switching between vacuum-suction, vacuum destruction, and positive pressure application to each of nozzles 19 at nozzle stop stations ST other than component holding and placing station ST1 without providing an individual driving mechanism that drives flow path switcher 32 for each station. Consequently, switching between states of nozzles at desired nozzle stop station ST in placing head 8 that includes the plurality of nozzles 19 is possible and thereby the downsizing of facilities and cost reduction can be realized.

In the component placing device of the embodiment, placing head 8 holding components by means of nozzles 19, which are under a negative pressure, places the components held by nozzles 19 at predetermined placement positions on board 3, and flow path switchers 32 that selectively connect suction paths of nozzles 19 to negative pressure flow paths leading to a negative pressure source and positive pressure flow paths leading to a positive pressure source and component detector 31 that detects components at the tips of nozzles 19 are included. In a configuration where take-away components are discarded at a predetermined component collection position in a case where the take-away components attached to nozzles 19 after component placement are detected by component detector 31, flow path switchers 32 switch suction paths 19a from a state connected to the negative pressure flow paths to a state connected to the positive pressure flow paths during component placement to put suction paths 19a under a positive pressure and to cause the components to be detached from these nozzles 19, and connect suction paths 19a to the negative pressure flow paths so as to put the suction paths under a negative pressure before the detection of take-away components is performed by component detector 31.

Accordingly, a defective board, which includes an extra dropped component since a take-away component that is generated during component placement and that is in a state of being unstably attached to a nozzle is dropped due to a shock occurred when the placing head moves, is prevented from being sent to the next step, and thereby the occurrence of a defect caused by a take-away component, which is generated during component placement, being accidentally dropped can be prevented.

In the component placing device and the component placing method of the disclosure, switching between states of nozzles is possible for the placing head that includes the plurality of nozzles and effects of the downsizing of facilities and cost reduction can be realized. Thus, the component placing device and the component placing method are useful in the field of component placement where components are held by means of a negative pressure and are placed onto a workpiece.

What is claimed is:

1. A component placing device comprising:
    a plurality of nozzles that put suction paths under a negative pressure to hold components;
    a plurality of nozzle shafts that hold the plurality of nozzles at lower end portions of the nozzle shafts so as to be freely replaceable and each of which has an internal flow path leading to a corresponding one of the suction paths;
    a rotating object that holds the plurality of nozzle shafts at equal pitches on a circumference of a circle, of which a center is a rotation axis, so that the plurality of nozzle shafts rise and fall freely and the rotating object rotates about the rotation axis to move the plurality of nozzles in turn to a plurality of stations including a component holding and placing station where operation of holding the components or placing components held by the plurality of nozzles at predetermined placement positions on a workpiece is performed and a component detecting station where detection of the components held by the plurality of nozzles is performed;
    a nozzle rising and falling mechanism that causes the plurality of nozzles to rise and fall at the component holding and placing station;
    a component detector that detects the components held by the plurality of nozzles at the component detecting station;
    a negative pressure flow path that is an air flow path formed inside the rotating object and leads to an external negative pressure source;
    a positive pressure flow path that is an air flow path formed inside the rotating object and leads to an external positive pressure source;
    a contact flow path that is an air flow path formed inside the rotating object and communicates with the internal flow path of each of the plurality of nozzle shafts;
    a flow path switcher that is internally provided in the rotating object, has a spool which moves by air for power, and causes the contact flow path to selectively communicate with the negative pressure flow path and the positive pressure flow path by movement of the spool;
    a first pilot flow path and a second pilot flow path, which are internally provided in the rotating object and through which air for power to drive the spool of the flow path switcher is supplied; and
    a communication plug for power air, which comes into contact with an exterior surface of the rotating object and through which air for power is supplied to the first pilot flow path and the second pilot flow path from the outside.

2. The component placing device of claim 1,
    wherein the rotating object has a flat ring-shaped contact surface that is an annulation, of which a center is the rotation axis, and that has a predetermined width in a radial direction when seen from a center of the rotation axis,
    a first opening, which is an inlet of the first pilot flow path, and a second opening, which is an inlet of the second pilot flow path, are disposed in the contact surface,
    the communication plug for power air includes at least a first communication plug for power air and a second communication plug for power air,
    the first communication plug for power air communicates with the first pilot flow path from the first opening in a state of being in contact with the contact surface, and
    the second communication plug for power air communicates with the second pilot flow path from the second opening in a state of being in contact with the contact surface.

3. The component placing device of claim 2,
    wherein the flow path switcher has a structure in which a first space provided on one end side of the spool and a second space provided on an other end of the spool side are included, the contact flow path communicates with the negative pressure flow path when the spool has moved to the other end side by air for power supplied to the first space, and the contact flow path communicates with the positive pressure flow path when the spool has moved to the one end side by air for power supplied to the second space,
    the first pilot flow path communicates with the first space,
    the second pilot flow path communicates with the second space,
    the first communication plug for power air communicates with the first pilot flow path from the first opening at the component holding and placing station, and
    the second communication plug for power air communicates with the second pilot flow path from the second opening at the component holding and placing station.

4. The component placing device of claim 3, further comprising:
    a third communication plug for power air,
    wherein the third communication plug for power air communicates with the first pilot flow path from the first opening at one of the plurality of stations after the component holding and placing station and before the component detecting station.

5. The component placing device of claim 4,
    wherein the third communication plug for power air communicates with the first pilot flow path from the first opening at a station next to the component holding and placing station.

6. The component placing device of claim 4,
    wherein, before the nozzles which have performed component placement operation at the component holding and placing station reach the component detecting station, air for power is supplied to the first pilot flow path through the third communication plug for power air in order to put the suction paths of the nozzles which have performed the component placement operation under a negative pressure.

7. The component placing device of claim 6,
    wherein in a case where the components are not detected at the component detecting station, air for power is supplied to the second pilot flow path through the fourth communication plug for power air in order to destroy vacuums of the suction paths of the nozzles where the components are not detected.

8. The component placing device of claim 6, wherein in a case where the nozzles perform placement operation of the components at the component holding and placing station and a case where the nozzles discard the components at the component holding and placing station, positive pressure air is supplied to the positive pressure flow path through the communication plug for positive pressure air in order to put the suction paths of the nozzles that perform placement operation of the components or the nozzles that discard the components under a positive pressure.

9. The component placing device of claim 3, further comprising:
a fourth communication plug for power air,
wherein the fourth communication plug for power air communicates with the second pilot flow path from the second opening at the component detecting station or a station after the component detecting station.

10. The component placing device of claim 2, wherein a third opening, which is an inlet of the positive pressure flow path, is disposed in the contact surface, and
the component placing device further comprises a communication plug for positive pressure air that communicates with the positive pressure flow path from the third opening in a state of being in contact with the contact surface at the component holding and placing station.

11. A component placing method for a component placing device that includes a plurality of nozzles that put suction paths under a negative pressure to hold components, a plurality of nozzle shafts that hold the plurality of nozzles at lower end portions of the nozzle shafts so as to be freely replaceable and each of which has an internal flow path leading to a corresponding one of the suction paths, a rotating object that holds the plurality of nozzle shafts at equal pitches on a circumference of a circle, of which a center is a rotation axis, so that the plurality of nozzle shafts rise and fall freely and the rotating object rotates about the rotation axis to move the plurality of nozzles in turn to a plurality of stations including a component holding and placing station where operation of holding the components or placing components held by the plurality of nozzles at predetermined placement positions on a workpiece is performed and a component detecting station where detection of the components held by the plurality of nozzles is performed, a negative pressure flow path that is an air flow path formed inside the rotating object and leads to an external negative pressure source, a positive pressure flow path that is an air flow path formed inside the rotating object and leads to an external positive pressure source, a contact flow path that is an air flow path formed inside the rotating object and communicates with the internal flow path of each of the plurality of nozzle shafts, a flow path switcher that is internally provided in the rotating object, has a spool which moves by air for power, and causes the contact flow path to selectively communicate with the negative pressure flow path and the positive pressure flow path by movement of the spool, a first pilot flow path, which is internally provided in the rotating object and through which air for power to move the spool to a position where the contact flow path communicates with the negative pressure flow path is sent, and a second pilot flow path, which is internally provided in the rotating object and through which air for power to move the spool to a position where the contact flow path communicates with the positive pressure flow path is sent, the method comprising:
positioning a target nozzle, out of the plurality of nozzles by rotating the rotating object at the component holding and placing station;
supplying air for power to the first pilot flow path to put the suction path of the target nozzle under a negative pressure;
holding the component by sucking the component by means of the target nozzle which is put under the negative pressure;
moving the target nozzle to the component detecting station by rotating the rotating object;
examining presence or absence of the component held by the target nozzle at the component detecting station;
in a case where the component is not detected at the component detecting station, blocking the suction path of the target nozzle from the negative pressure flow path by supplying air for power to the second pilot flow path;
positioning the target nozzle at the component holding and placing station by rotating the rotating object; and
placing the component held by the target nozzle by supplying air for power to the second pilot flow path to put the suction path of the target nozzle under a positive pressure from the positive pressure source.

12. The component placing method of claim 11, further comprising:
after the placing of the component held by the target nozzle, supplying air for power to the first pilot flow path to put the suction path of the target nozzle under a negative pressure;
moving the target nozzle to the component detecting station by rotating the rotating object;
examining whether or not the component is left at a tip of the target nozzle at the component detecting station; and
in a case where the component is not detected at the tip of the target nozzle at the component detecting station after placing of the component held by the target nozzle, blocking the suction path of the target nozzle from the negative pressure flow path by supplying air for power to the second pilot flow path.

13. The component placing method of claim 12, further comprising:
in a case where the component is detected at the tip of the target nozzle at the component detecting station after placing of the component held by the target nozzle,
positioning the target nozzle at the component holding and placing station by rotating the rotating object; and
discarding the component left at the target nozzle at a predetermined component collection position by supplying air for power to the second pilot flow path to put the suction path of the target nozzle under a positive pressure from the positive pressure source.

* * * * *